(12) United States Patent
Jennion et al.

(10) Patent No.: US 6,882,950 B1
(45) Date of Patent: Apr. 19, 2005

(54) BUILDING AND TESTING COMPLEX COMPUTER PRODUCTS WITH CONTRACT MANUFACTURERS WITHOUT SUPPLYING PROPRIETARY INFORMATION

(75) Inventors: Mark W. Jennion, Chester Springs, PA (US); Gerald J. Maciona, Mounds View, MN (US); William K. Shramko, St. Paul, MN (US)

(73) Assignee: Unisys Corporation, Blue Bell, PA (US)

( * ) Notice: Subject to any disclaimer, the term of this patent is extended or adjusted under 35 U.S.C. 154(b) by 85 days.

(21) Appl. No.: 10/603,446

(22) Filed: Jun. 25, 2003

Related U.S. Application Data
(60) Provisional application No. 60/440,724, filed on Jan. 17, 2003.

(51) Int. Cl.[7] .................... G01R 27/28; G01R 31/00; G06F 11/00
(52) U.S. Cl. ................. 702/118; 702/59; 714/25; 714/27
(58) Field of Search ................. 702/118, 117, 702/58, 59, 57; 714/25, 27, 30

(56) References Cited

U.S. PATENT DOCUMENTS
2002/0170000 A1 * 11/2002 Gorodetsky et al. .......... 714/30

* cited by examiner

*Primary Examiner*—John Barlow
*Assistant Examiner*—Meagan S Walling
(74) *Attorney, Agent, or Firm*—Michael B. Atlass; Mark T. Starr

(57) ABSTRACT

Building and testing complex electronic products especially large scale computer systems are handled with control remaining with the owner of the design while a contract manufacturer does the basic manufacturing processes and testing. Nearly all levels of testing are accomplished without sharing high level descriptions of the end product or its features by providing only low level files for test functions. Testing is accomplished without sharing the high level code descriptive of the system design so confidential information is retained. Testing using the low level data is made sufficient to identify what parts need repair despite the lack of high-level information transfer.

24 Claims, 22 Drawing Sheets

FASTER FEEDBACK (DECREASED INVENTORY, QUICKER LEARNING, BETTER YIELD)
IMPROVED DATA COLLECTION (IN-HOUSE TESTING)

(THIRD PARTY-ENABLED TESTING)

UNIT TEST TO SVF FORMAT CONVERSION PROCESS

GENERATESVFFILE FLOWCHART

TCL CODE FOR INITFORGENERATE COMMAND FOR TCL TO SVF FORMAT CONVERSION

TCL WRITEINITSTATE COMMAND FOR SVF TO TCL CONVERSION

SAVE STATE TEL COMMAND FOR TEL TO SVF CONVERSION

TCL CODE TO CONVERT AFTER COMMAND TO SVF FORMAT

TCL CODE TO CONVERT FORCE COMMAND TO SVF FORMAT

TCL CODE TO CONVERT VALUE COMMAND TO SVF FORMAT

EXPANSION OF OUTPUT VALUE INSTRUCTIONS IN QUEUE (IIIa AND IIIb) FROM FIG. 10F AND 10G

BUILDING AND TESTING COMPLEX COMPUTER PRODUCTS WITH CONTRACT MANUFACTURERS WITHOUT SUPPLYING PROPRIETARY INFORMATION

RELATED APPLICATIONS

This patent is related to two other patents filed on even date herewith entitled TEST APPARATUS TO FACILITATE BUILDING AND TESTING COMPLEX COMPUTER PRODUCTS WITH CONTRACT MANUFACTURERS WITHOUT SUPPLYING PROPRIETARY INFORMATION; and USING CONVERSION OF HIGH LEVEL DESCRIPTIVE HARDWARE LANGUAGE INTO LOW LEVEL TESTING LANGUAGE FORMAT FOR BUILDING AND TESTING COMPLEX COMPUTER PRODUCTS WITH CONTRACT MANUFACTURERS WITHOUT PROPRIETARY INFORMATION in that they have substantially similar disclosure and in that all three claim priority from the same provisional application, Ser. No. 60/440,724 filed Jan. 17, 2003.

FIELD OF THE INVENTION

This invention relates generally to manufacturing processes in general and has particular application to building large-scale electronic machines with complex circuit boards that require extensive circuit testing, such as for example, multiprocessor computer systems.

BACKGROUND

It is a given in business today that it is cheaper to have the most capable entity build world-class goods or provide world-class services instead of having one company try to do all business functions of its business. Payroll, accounting, legal services and even manufacturing have become outsourced to various suppliers whose own business focus is on providing that same service to multiple client businesses. Thus, much electronic manufacturing today is provided by outsourcing most or all of the manufacturing process to various suppliers, manufacturers and assemblers.

Testability features of complex electronic systems are a necessary feature to assure reasonable production results, and therefore manufacturers and designers build and design including capacity for testability into nearly every stage of the production process. With millions or billions of circuits all expected to function together perfectly, designing for testability at nearly every phase of the production cycle has become a way of life. Wafers are tested, chips are tested, and then circuit boards are tested before and after being populated with components. If testing comes late in the manufacturing process, at a populated circuit board level, for example, the board may have already been populated with expensive components before a low level trace is discovered to be an open circuit, potentially causing loss the of the entire board developed up to that point. Thus testing at the lowest level possible is desired. Further, shipping a board that has been tested to another facility where it may be assembled into a larger machine may be an independent cause of the failure of the machine to have satisfactory test results, so testing at the location where the machine or subassembly is assembled may reduce the back and forth discussions over where a failure occurred when shipping is a part of the assembly process. In general, the most recent manufacturing step needs to be verified as having been done correctly before moving on to any subsequent manufacturing steps. This fact affects many related aspects of the downstream manufacturing steps, including diagnostic ability, for example, cost of repair and so forth, are much more complicated.

It should also be recognized that enormous amounts of information transfer between the initiating company and the manufacturing/assembling/testing company typically have to occur in order for a complex electronic product to be assembled and tested satisfactorily. This is a significant cost burden to the process. Further, trained individuals in third party manufacturers show high levels of turnover, getting different jobs in some other company after being trained, thus increasing the loss of sunk costs for this information transfer process. Therefore we have to count on people whose technical abilities are low, and who may be transitory, shift, and production assembly line workers often without specific technical educations.

Accordingly, in the manufacture of very high technology machines such as large scale computer systems, it becomes a significant impediment to successful outsourcing of manufacturing to push significant testing functions into the third party manufacturer/assembler/tester.

This is complicated further because although the design may be a highly prized and confidential element of the finished product, it is important to be able to allow a manufacturer/assembler that is operating as a subcontractor to the owner of the design to provide significant testing functions, or else the boards have to go back and forth before a machine of multiple circuit boards can be assembled with any level of comfort that the finished product will function as intended.

Also, a great many complex circuit boards may go into a machine and they may be of different kinds. Product cycles turn over within every few months. Therefore, with new test fixtures and other hardware to hold them and new programs for each board being required, it becomes very expensive to assemble and maintain test equipment and software for each of the boards. The cost of scraping boards resulting from an inability to repair immediately becomes very high without complete diagnostics. This is at least partly because if one can't sell a new product within months of production it will probably be obsolete and unsaleable.

It should be noted that, at the present time, functional testing is available through subcontracting manufacturers using the targeted environment (i.e., what they refer to as "gold" machines). They also use what is referred to as "rack and stack" equipment (that is, machines of cobbled together boards in a test frame) that mimics the targeted environment on a custom basis to connect signal generators as if it were in the target environment. However, the ability to test all the circuits on the VLSI chips and ASIC chips on circuit boards after they are populated onto the boards is limited to testing at special equipment, not usually available to the subcontracting manufacturers for many or all of the reasons stated above. This slows down and complicates production of large-scale electronic systems. In the subcontracting manufacture's factory, if a unit under test fails in a functional test, there is no real detail presently available at that factory, related to why it failed, or what to fix.

When a board or assembly is assembled, it must be tested to verify correct assembly. Such testing can take any of several forms. One form is Edge Test, in which the tester connects to the board/assembly through the signals that comprise the system-level inputs and outputs of the board/assembly. Often, these signals are at a connector at the edge of a circuit board—that's how the name "Edge Test" comes about. To be practical, edge testing requires the board/assembly to have characteristics that enable an Edge Tester to be general (so that the tester can be reused for multiple types of boards/assemblies) and to be relatively simple (so as to reduce the time and cost for test development and for test application). The desired characteristics are not likely to be present unless certain consistencies are designed into the board/assembly. When designs are consistent in certain fundamental ways, the processes for generating tests and applying them can be automated. In the current era of complicated boards/assemblies, automation is absolutely essential for making testing affordable.

Historically, board test methods have evolved. About three decades ago, when boards were smaller and simpler, testing was commonly done by applying functional test vectors through the I/O pins of the board. Test vectors might have had to be generated manually by someone with knowledge of the functional design.

As boards became more complicated, an In-Circuit Test method evolved in which a fixture had probes that could contact each net on a board. Through the probes, the tester could test individual components, one at a time—a much simpler task than testing multiple components as a combined logical entity.

In recent years, boards have become so dense and complicated physically that more nets are inaccessible to fixture probing. Access is returning to the board edge but new Edge Test methods require the board to be designed to support standard methods for automatically generating test vectors.

Accordingly then, there are several coincident needs which must be attended to in order to take advantage of the economic imperative to outsource manufacturing, while at the same time providing some level of assurance to the owner of the designs that the manufacturing subcontractor will not be able to turn over or otherwise use the benefits of the owner's designs to the owner's competitors (because of the use of proprietary information. Also the training costs to teach them are high for something only for your benefit so they may not want to learn it. Also personnel turnover is high). At the same time, it is of benefit to the contracting manufacturer to be able to cheaply test complex circuit boards of rapidly multiplying variety to ensure continued growth of its outsourcing income.

If there were testers and methods such as are needed, that is ones which limit the amount of redesign and development of software and hardware testing tools another positive aspect is that such an invention will greatly reduces cycle time to ensure that more product gets tested sooner.

SUMMARY OF THE INVENTION

By supplying or establishing in a manufacturing operation a flexible test equipment device which can handle multiple boards, we establish flexibility and reduced cost in production of complex electronic systems, particularly computer systems. By establishing only gate level test vectors and descriptions for use in the tester, we maintain control with the owner of the design for these system while enabling high-level testing at the manufacturer. In a first phase of edge testing, we attempt to use standard boundary-scan chains built into a board/assembly to detect and isolate manufacturing defects where physical diagnostics are used with relatively simple purchased tools and test equipment which generate and apply test vectors. (An example of a physical diagnostic output is an indicator that says for one example, "pin22; U421; stuck Hi"). In a second phase, we use system interfaces and system-level tests at speed in order to augment boundary-scan tests in detecting and isolating manufacturing defects, to detect timing deficiencies due to manufacturing defects, and to detect defects in complex components such as RAMs, ASICs and the like. In a third phase, we apply Edge Tests in an environment for Environmental Stress Screening(ESS) in which temperature, voltage, and possibly vibration are varied. Compared to the ESS system level, HLA (High Level Assembly) ESS allows for higher levels of stress and isolation is more straight forward.

Details of the tester, and the software used to enable these features are explained within the detailed description section below.

BRIEF DESCRIPTION OF THE DRAWINGS

(FIG. 5B has only one test fixture shown).

DETAILED DESCRIPTION OF THE PREFERRED EMBODIMENTS

Figure 1:
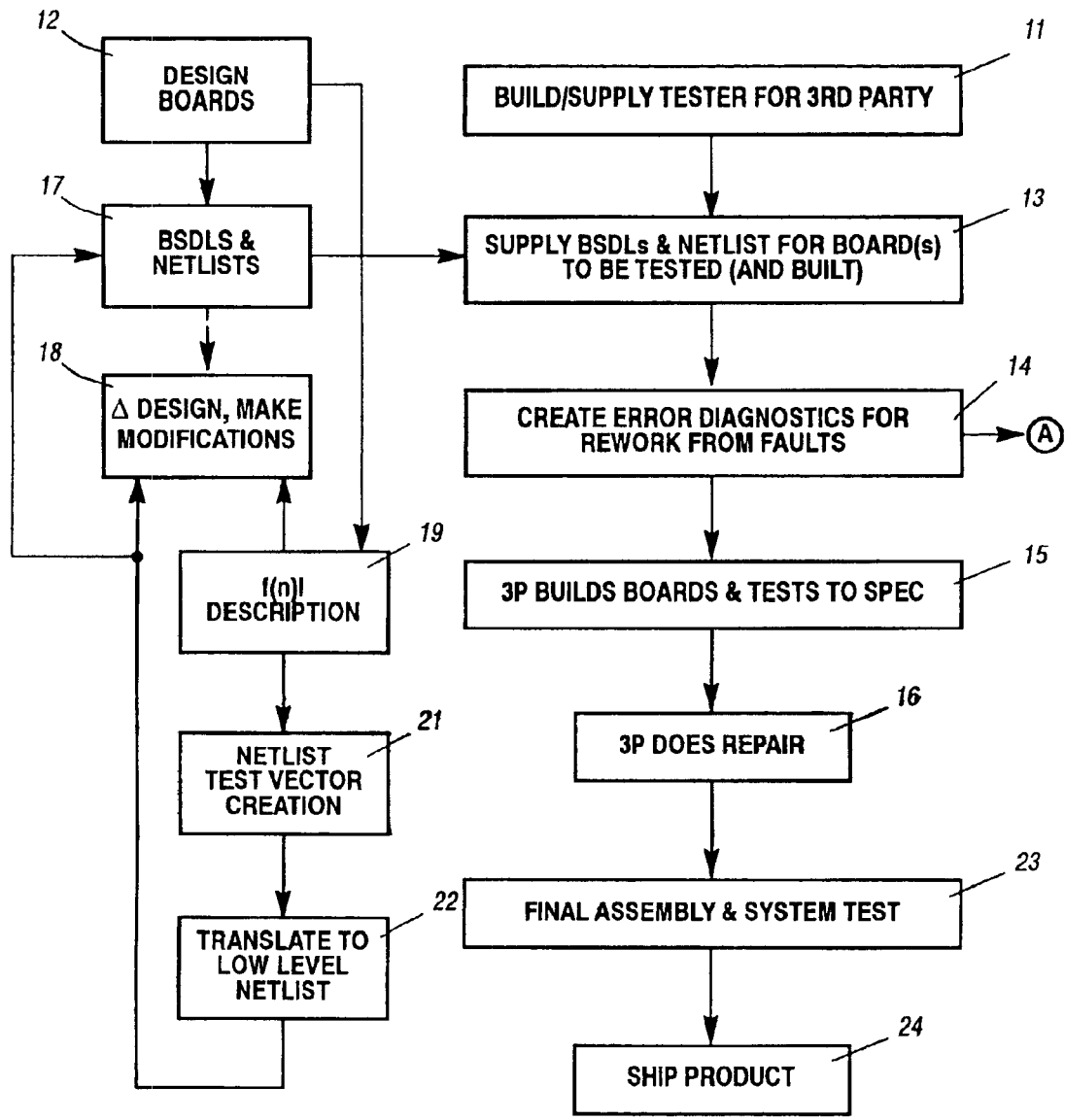
FIG. 1 is a flowchart of a preferred embodiment process in accord with the invention.

One of the primary problems addressed by this invention is establishing improved manufacturing and testing capability in a third party. However, it should be recognized that the features inherent in this system and process description can be applied both to an integrated manufacturer, to third party manufacturers and assemblers and testers who have contracted to do parts of the work under agreement with an owner of a technology or product set.

In our facilities at Unisys, for example, we produce multi-processor circuit boards of six different varieties including low power varieties which can all be tested on the same tester without changing any of the hardware. Therefore, by using a highly flexible tester platform that employs distributed power (capable of delivering power to circuits under test requiring both 48, 12, 5.0, 3.3, 2.5, and 1.8 volts for example), multiple boards of differing power requirements we can use a single edge tester for a multiplicity of boards. Only the connector fixture in electronic software has to be modified if the boards have different logical I/O pins, while the mechanical connection and the same power pin definition are used.

We preferably employ publicly available JTAG Technologies (a Netherlands company, and also an international standard by that name, standing for Joint Test Action Group) boundary scan software and require its use by our third party testers. While other standards could be used, this one is well established and well known by many in the relevant industry and therefore strongly preferred. We also provide to our third party testers a unique group of reference software files (for example board net list files in for example Mentor-Neutral files or Cadence .BRD files) that describe how the components are interconnected on a given board to be tested. These netlists are thus useable by the boundary scan software for each unique circuit board (or at least for each model and type of boards), to generate high level tests that run net-name level physical diagnostics. Because we are only supplying netlist data and device BSDLs, we are still able to retain control of proprietary information about what is being tested and yet allow the manufacturer/assembler/tester to adequately test our boards. The third party testers generate physical net name level diagnostics from these files and these are used to generate high level tests that run to determine faults at that level. The third party testers can generate reports for each board requiring repair that allows them to physically identify on their own what problems were discovered on the board and determine how to correct them. Because the tester is working with physical components in these tests the report may identify that, for example, a parity bit error occurred on a particular bus by number, and if lower level testing is done, it can identify the error by bit, pin number, and part's reference designator numbers.

Also, using a setup which requires no more from our third party manufacturer/assembler/tester than training required to perform static interconnect testing, we obtained static and dynamic logic level testing throughout proprietary ASIC circuitry as well as the interconnect testing using boundary scan design language features built into our tester.

By virtue of the fact that we have built into all of our processor and memory boards a maintenance connector which uses a common scan engine tap linker or interface in a logic card, we are also able to test many of the features that would otherwise only be available at the system level for dynamic testing while we are testing at the board level.

This patent also describes various unique features of our "edge" tester and testing processes including a bar code scanner for determining which board is being applied to the tester and a safe insertion and connection process by which the tester prevents mishandling and misinsertion of boards under test. We also describe how TCL language file may be converted to a SVF file for use by the JTAG Technologies boundary scan software without revealing the proprietary information available by inspection of the TCL code file. (TCL is an internationally recognized software language with a detailed description available at several freeware locations on the internet, one URL is: http://www.tcl.tk/. Alternative languages could be used such as the currently popular C# language commonly used by Microsoft). (SVF is an acronym for a hardware description language codified in IEEE standard 1149.1 instructions. A document, currently at a Texas Instruments website (noted in an accompanying information disclosure for this patent): which describes SVF on page 47 et seq and provides useful background on HSDL, 1149.1 and related topics). By providing only a low level language file, useful descriptive information about the circuitry the assembler has when he received this file is not revealed.

Figure 2:
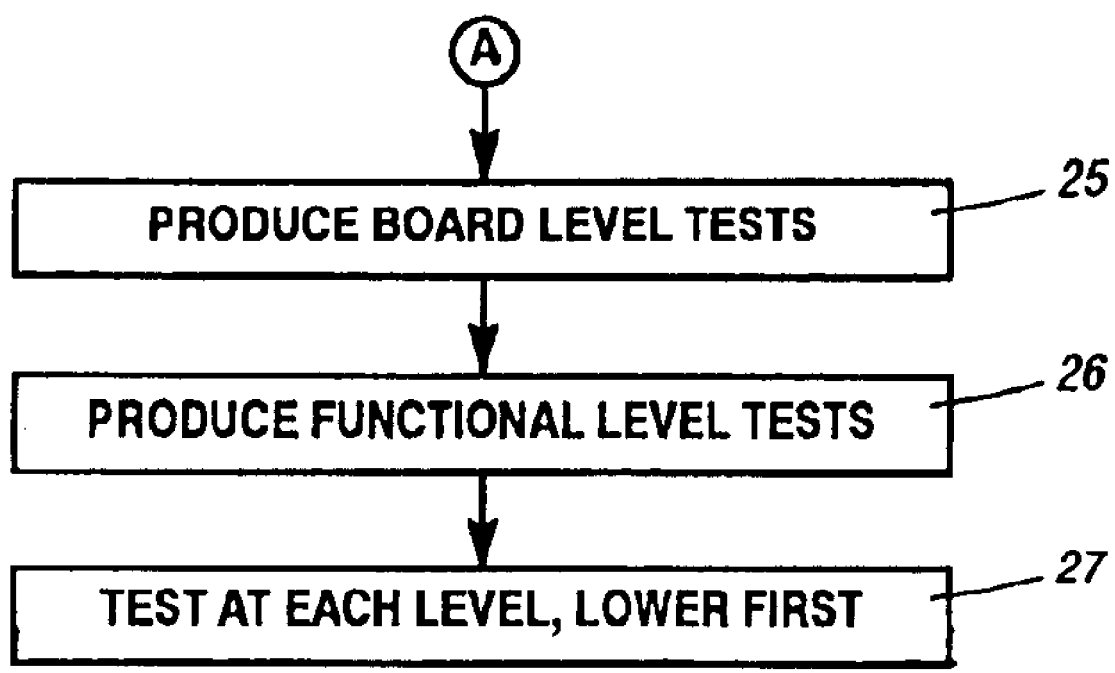
FIG. 2 is a subsidiary flowchart for the flowchart of FIG. 1.

Refer then to FIG. 1 in which the flowchart 10 generally describes a preferred embodiment of the inventive process. In designing a complex computer system, the builder of that system will first design boards Step 12 and from these net lists describe the various components on the board and their connections will be produced Step 17. A preferred descriptive language is TCL which we translate into the SVF code format for use with BSDL files, which translation we give to our third party manufacturer/assembler/tester. (For how this translation is done, refer to the discussion related to FIG. 8, below.) On another track Step 11, an edge tester will be designed which emulates the computer platform in which the boards designed in Step 12 will be tested. The tester will have a fixture for connecting to the board under test through which the tester must supply appropriate power supply leads and test leads to the circuit board that will be tested. It should be connected to or contain a small computer system (a PC computer or PC computer board) which will operate the test software to push signals and power through the connections to the circuit board under test in the test fixture. Using the TAP interface described in the literature or some variation of it, anyone can build an edge tester so long as the TAP interface is built into the boards to be tested. The net lists for the circuit boards to be tested will be supplied to the manufacturing operation in Step 13. From these a set of diagnostics and errors from repair from faults will be developed Step 14. As with the testing itself, the error diagnostics will be produced at lower to higher levels and can be produced by the assembler/tester using, for example, the JTAG technologies boundary scan products available from JTAG Technologies of Eindhoven, The Netherlands. In FIG. 2, these levels are described as producing board level tests Step 25, producing functional level tests Step 26, then testing at each level Step 27. The third party manufacturer will then build the boards according to the design description given earlier, and test the boards according to the tests produced in Step 14, in Step 15. If there is any repair to be done on the boards, the third party manufacturer can do the repair in Step 16 rather than sending the boards back to the assembly plant to be tested at a higher system level test and there determined to be either working or not working. By keeping all the testing in one plant, there is no question as to where the problems with the device originated or whether perhaps the board has been broken in shipping. Thus, once a board has been properly tested and assembled, it can be shipped or assembled into a large system and system level tests can be performed Step 23. Once these system level tests are completed, the product can be shipped Step 24 to the customer.

Due to the speed with which modified and/or new products are demanded in the marketplace at the current time, changes in design and modifications to the design (step 18) may occur at any time. These will generate new BDSLs and net lists Step 17 which will again be supplied to the assembler of the boards so that the boards can be tested in Step 13. As certain customers will retain old products and to the extent one wishes to maintain an ability to produce boards compatible with or the same as those in older products, one will need to keep the net lists for each product that is built, assembled, and tested through this process. It should be noted that especially with complex circuitry, functional descriptions are often generated Step 19. At a functional level, net lists and test vectors can be produced in Step 21. However, in order to maintain control over the proprietary information inherent in the functional description, a translation to low-level net lists in Step 22 should as a matter of course be performed so that the net lists provided at Step 17 will contain only information at the gate level, at least in our preferred embodiments.

Figure 1A:
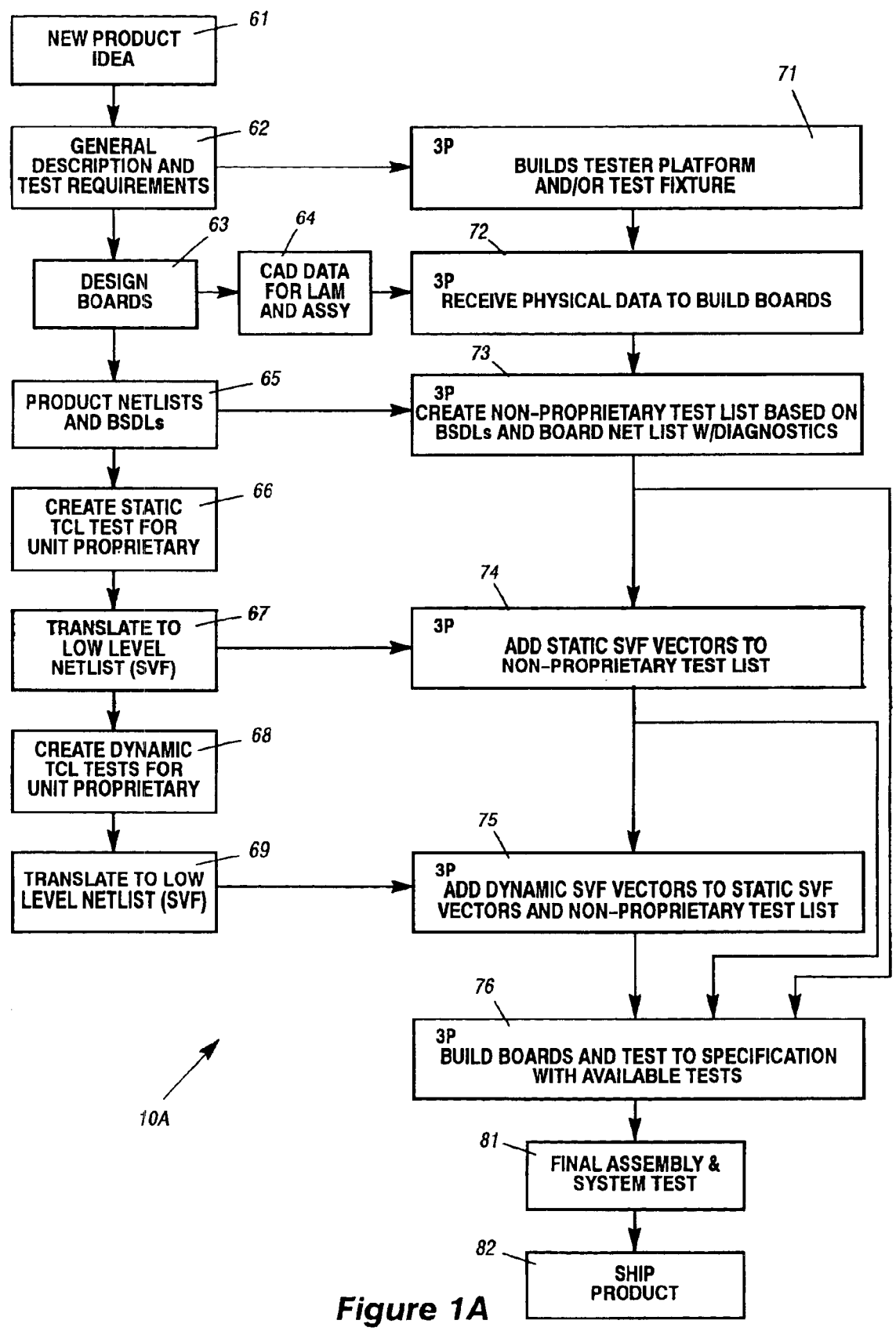
FIG. 1A is a flowchart similar to that of FIG. 1 but clarified to separate completely the third party activities.

A clarification of this process is illustrated in the flow chart 10A of FIG. 1A which identifies owner-activities on the left side and third party activities on the right side (with the exception of the last two steps which can be done by either or both parties as may be desirable). Generally the process starts with a new product idea 61, and its refinement into description and test requirements by the owner of the idea n 62. The general description and test requirements are ideally communicated to the third party assembler/tester/manufacturer so it can build 71 a tester platform and/or test fixtures as may be required. The owner then designs 63 the circuit boards and delivers 64 the needed CAD data for LAM and assembly to the third party, so it can start to build 72 the boards. The owner then produces and sends 65 Netlists and BSDLs to the third party to create 73 non-proprietary test lists based on BSDLs and board net lists with diagnostics.

In the first phase we build 66 static tests using TCL (TCL is commonly called "Tcl", an open source hardware descriptive language available through SourceForge.). These are translated into low level Netlist descriptive files in SVF format, and sent 67 to the third party, who will add 74 the static SVF vectors to the non-proprietary test list. In the second phase, we also build 68 dynamic TCL tests for the unit and translate 69 these into low level netslists in SVF compatible format. These translations are sent to the third party to add 75 dynamic SVF vectors to Static SVF vectors and the non-proprietary test list. Using the information received into blocks 73, 74, 75, the third party can build boards and test them to specification with available tests 76.

Final assembly and system test 81 and product shipment 82 can occur at the third party or at the owner's location, or at the third party's site if that is desirable.

Figure 3:
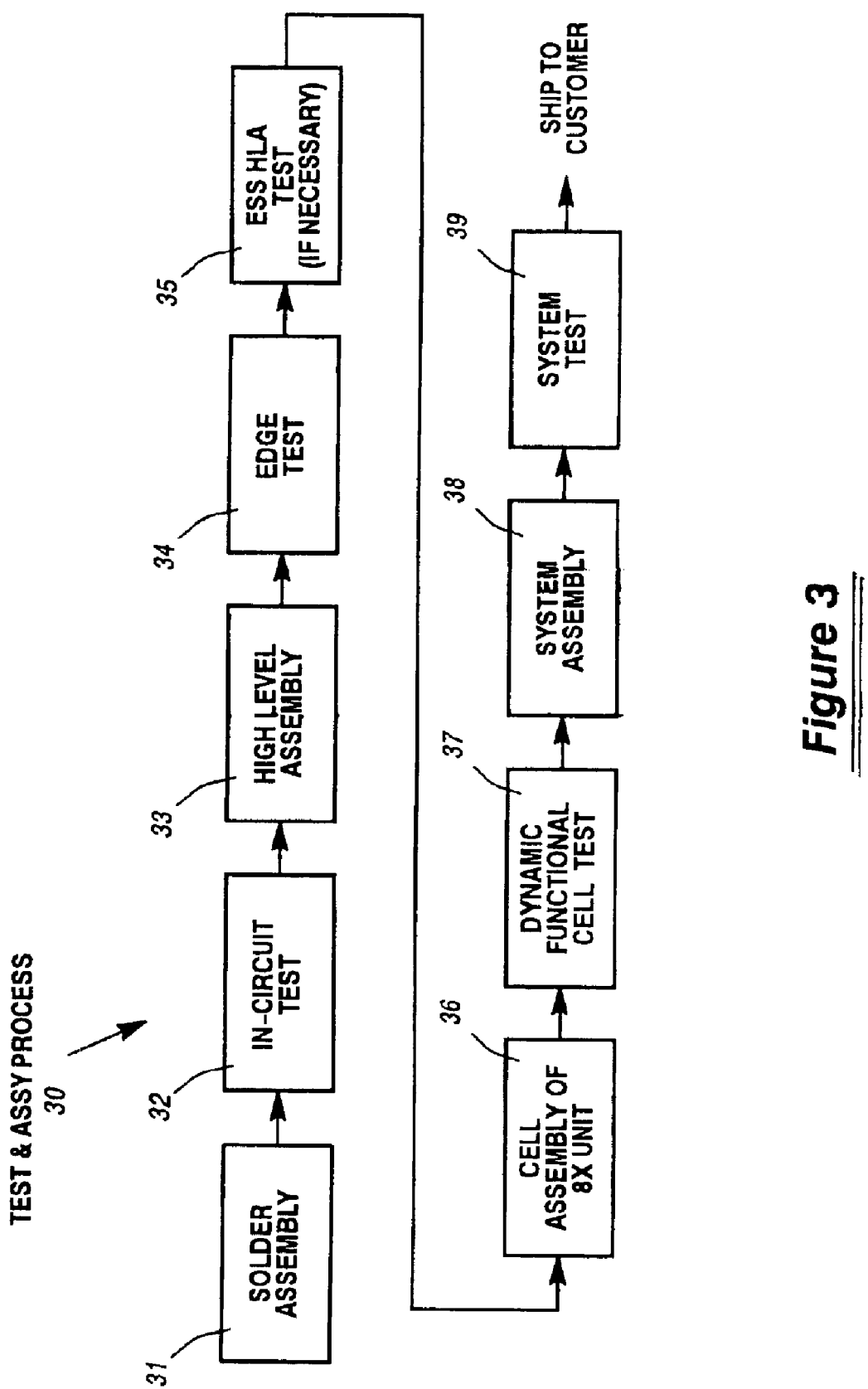
FIG. 3 is a flowchart of the phases in the build/test process for which the invention is useful.

In FIG. 3, the test and assembly process 30 is described as a linear process. The boards are first built with soldered components in Step 31. In-circuit testing is performed in Step 32. High level Assembly (HLA) is then completed in Step 33 and edge testing Step 34 is then completed. For small computer systems, this may be sufficient however, in many of the systems we design, we have assemblies of circuit boards wherein the entire assembly is mounted into a cabinet as a unit. Accordingly, cell testing of such assemblies to test the dynamics of the interaction of the components within the cell, must be conducted. Again to avoid shipping and problems with determining where (i.e., plant or facility) a failure occurred, we prefer to do cell level testing at the manufacturer/assembler/tester's facility. If there is going to be environmental stress testing, this should preferably be performed before the cell assembly is completed, or tested at the same location after the cell is completed, also. Thus, in this linear diagram of the process 30, the ESS HLA test Step 35 occurs prior to the cell assembly Step 36. In one of our computer systems, a cell will be assembled including up to eight processor boards. In Step 37 the dynamic functional cell testing is accomplished and in Step 38 the system is assembled. Final system testing 39 may then be done and the product shipped to the customer.

Figure 4A:
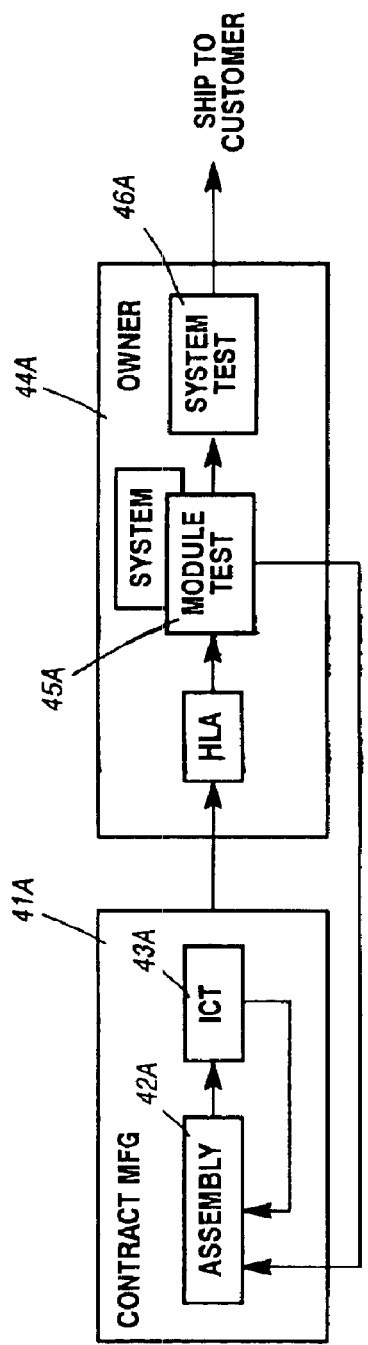
FIGS. 4a and 4b are block diagrams describing two models of the assembly/test process.
Figure 4B:
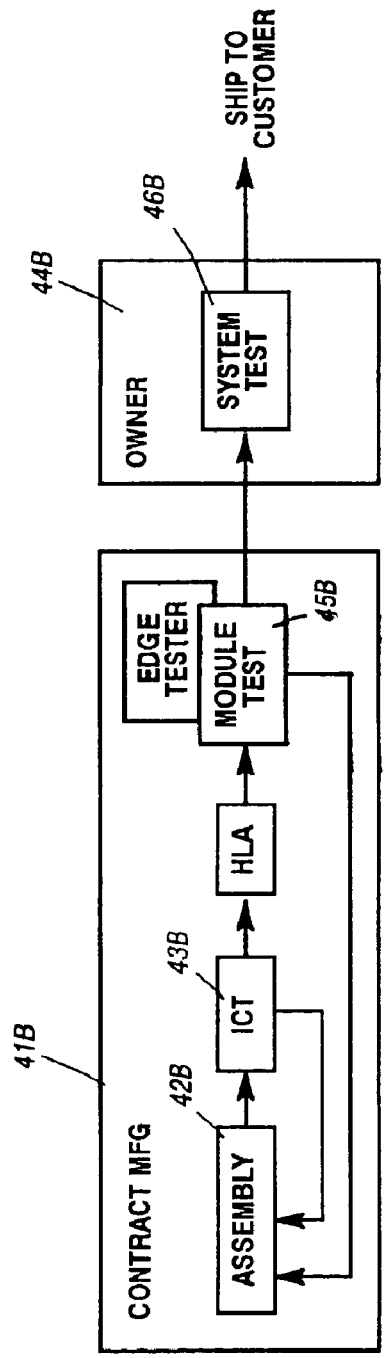

In FIGS. 4a and 4b, the location centricity of the manufacturing process is illustrated. We employ a contract manufacturer 41A to do the board creation and assembly 42A and the in-circuit testing 43A. Back arrows show repair and root cause information from in-circuit testing failures back to the assembly process. Assuming that the boards have been assembled and in-circuit tested appropriately, the modules which are then High Level Assemblies may be tested by the owner of the process 44A in a system or test system 45A. Following this, assuming there is no repair in which the module will be sent back to the contract manufacturer for assembly, a test of the entire system may be then conducted 46A. At this point, the product should be ready to ship to the customer assuming the system test is satisfactory. In FIG. 4b, using the inventive edge tester, the contract manufacturing process 41B is much more robust. The assembly 42B and in-circuit testing Steps 43B are still performed by the contract manufacturer. Here, however, the module testing of the HLA modules assembled from the assemblies of block 42 may be completely performed by the contract manufacturer 45B. The owner of the process may still perform system tests 46B at the owner's plant 44B before shipment of the system to the customer. However, it is possible to perform even system level testing at the contract manufacturer if desired, and even shipment to the customer could come from the contract house.

Figure 5A:
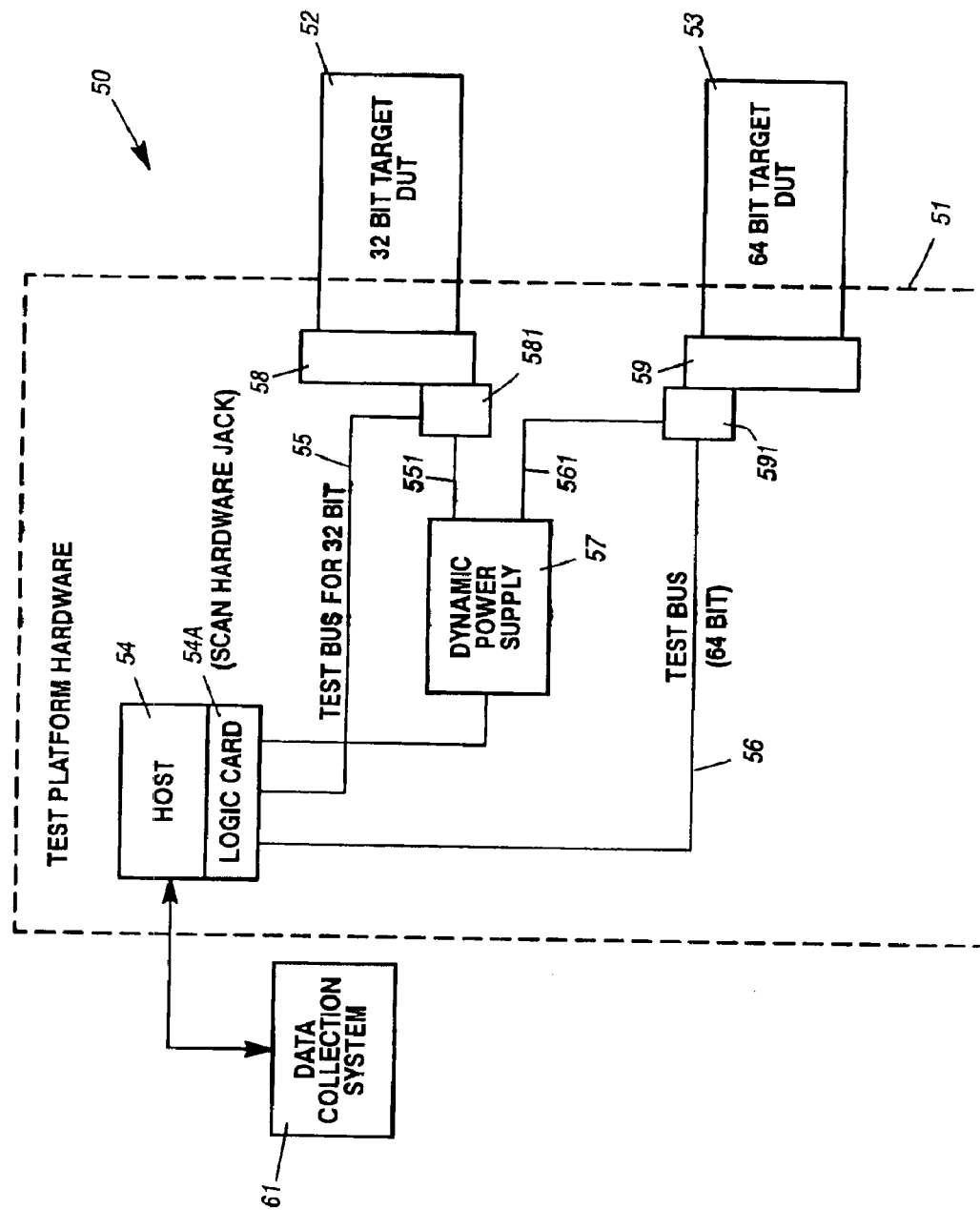
FIGS. 5A and 5B are differently formatted high-level block diagrams of a tester unit also called an edge tester in accord with a preferred embodiment of the invention.
Figure 5B:
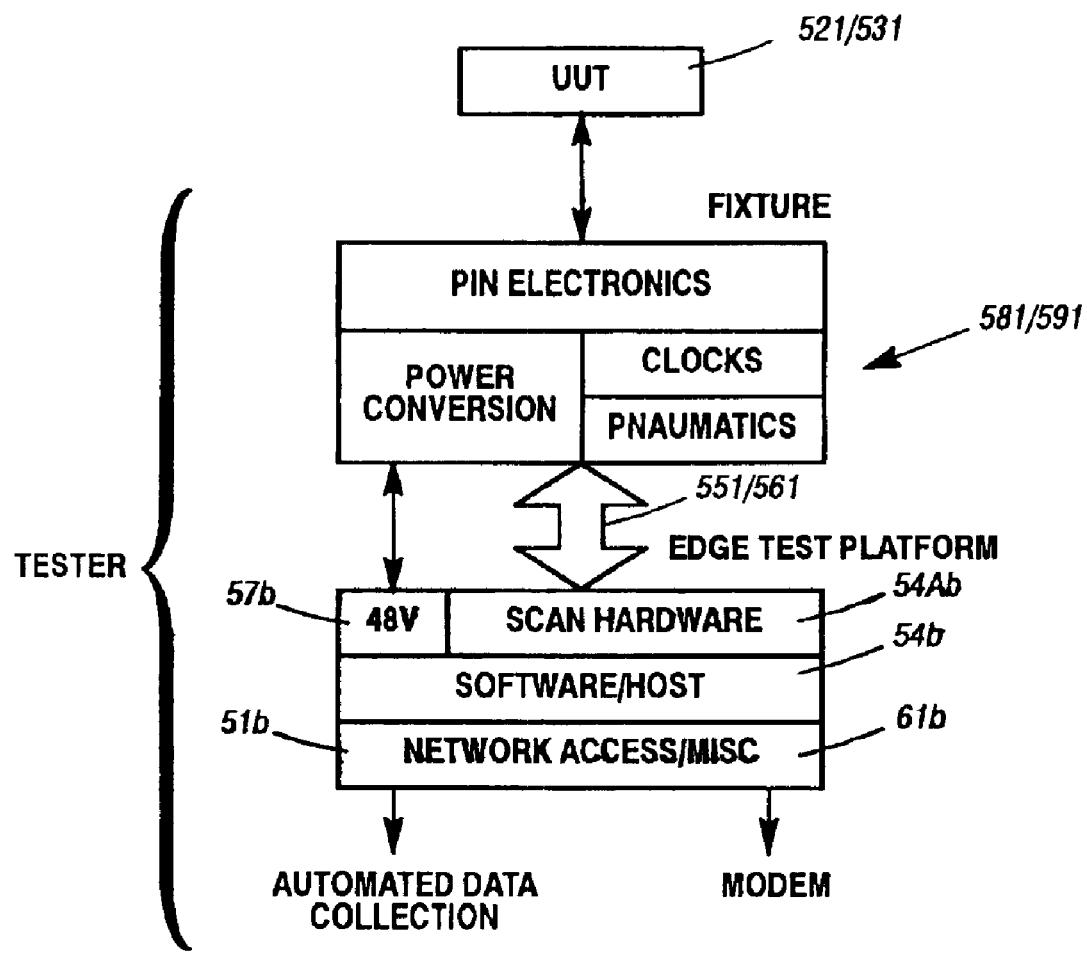

FIG. 5A illustrates the test platform hardware system 50. In the preferred embodiment form, it uses a 19 inch rack mount cabinet (we call it an edge tester) 51. FIG. 5B is another logically arranged block diagram view of the tester hardware, showing only one device under test (UUT). Referring first to FIG. 5A, included is a host 54, including a logic card 54A. The tester hosts in the preferred embodiment is a standard PC with the Windows Graphic User Interface Operating System. This tester host includes commercially available software and hardware (the PCI Card that drives the bus) from JTAG Technologies and is associated with a data collection system 61 which holds both the net lists and test vector files supplied by the processes described earlier and the test result files from testing of the boards. The logicard 54A must be specially designed to mimic the connections that the board will encounter in the product system. It functions as a scan hardware block. In Unisys, the connections for this include shielded clock signals (these are clocks that can run at high frequency, sometimes called "at-speed") and tap linker pins or connectors to connect the common scan engine interface to the maintenance processor used by the Unisys systems. The JTAG Technologies company software operates over a five pin connector they call a tap, which specifies an in, and out, a reset, a (test) clock and a user-defined pin. This is consistent with IEEE standards and easily adaptable to the Unisys tap linker input/output pins, as it should also be with any other systems. Alternate connectors could be supplied if different software is employed, but this set of tap signal pins is preferred. The test vectors will be pushed through the in and out pins, generally using such a system. Similar circuitry should be supplied by any manufacturer wishing to test the maintenance system vis-à-vis the boards at this level. In other words, where the manufacturers design for test rules require that certain pins be brought out, those pins should be made available through the logicard to the software provided on the host so that appropriate test vectors may be used against those pins.

The Unisys CMP platform provides both 64 bit and 32 bit processor boards so, we have produced an edge tester platform that tests both 32 bit target devices and 64 bit target devices. Having an edge tester that mimics a family of computer systems makes this entire effort very efficient since we only need to produce a single edge tester for all boards connected to the backplane in the finished product.

Accordingly, we have two different edge connector assemblies 58/581 and 59/591 (i.e., mating connectors) for those two DUT's 52 and 53, respectively.

We also provide a dynamic distributed power supply unit 57 which is configurable by software on the host 54.

The mating connectors provide for the connection and testing of all pin connections in static mode, including specifically the general I/O pins which may have address data and control functions, the maintenance pins which in our systems connect through the TAP linker and are used for pushing test vectors into and through the circuits in the chips on the boards, power, and clocks. The continuity and other static tests are done on all these pin connections. Power and clocks are sometimes distributed from the board being tested to peripherals connected to the boards, so testing for those outputs may be important also and we provide for it. Thus clock sensing detectors and power sense circuits are made available to the tester through the mating connector. In some boards the mating connector may be a multi-part design, depending, of course, on the need to accommodate the to-be-tested board's physical design.

In Unisys computer systems, some of the boards require multiple levels of voltage to be supplied. Typically, we use a 48 volt, a 3.3 volt, and a 12 volt power supply system. We use voltage regulating modules (VRM) preferably of the type currently supplied by Lucent Technologies, Inc. which allow for us to do voltage margin testing thus, using a programmable VRM, we can shift the available voltage up or down somewhat to determine failures that might occur when the components are somehow not up to specification. The test vectors to whichever pins are available to the boards under test in the fixtures 58 and 59 are provided and controlled over test buses 55 and 56, along with lines 551 and 561 to control clock generation and other logic that resides on blocks 581 and 591.

It is possible to use a single computer like the host computer 54 on the edge tester to run multiple edge tester platforms simultaneously through a network connection, but currently we find that we handle sufficient testing volume with a single edge tester. Further, a network connection can be used to provide remote debug and remote support with programs like PC-anywhere or other remote control software loaded on the host computer 54. Also, the fans for cooling the boards under test may be run by the host computer test program and even shut off to do environmental stress testing if desired.

Refer briefly to FIG. 5B. Here the elements of the fixture 581/591 connecting to the device under test (UUT 521/431) is illustrated, indicating that the Pneumatics for connecting, the clocks the power conversion (where appropriate) and the pin electronics for interfacing to the edge of the board to be tested are housed in this fixture. The bus 551/561 carries the scan data from the scan hardware logic card 54A$b$ of the Test Platform Host 54$b$. Network access for controlling the testing from afar is present in the block 61$b$, which in FIG. 5A was viewed only as a data collection system. It is preferred that the owner be able to download instructions and files directly to the test fixture, and to that end a Modem or other (internet, wireless, etc) connection may be provided. The Power is preferably provided by the 48 Volt source 57$b$ to the power conversion block of 581/591. All these components are preferably on the tester 51$b$.

Figure 6:
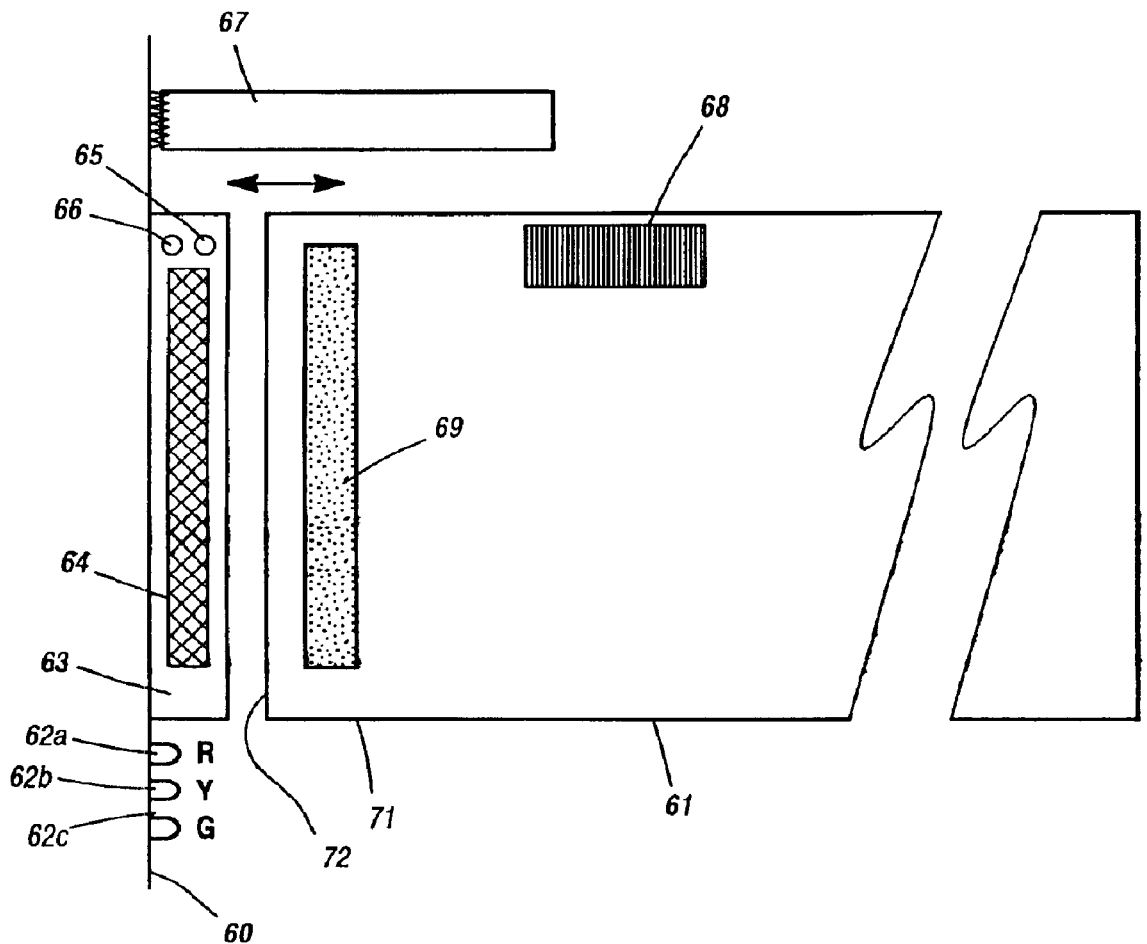
FIG. 6 is a simplified mechanical diagram of a part of the tester having a fixture into which a device under test is inserted and illustrates various mechanical features associated therewith.

By the time in the manufacturing process that a board is populated with application specific circuits (ASICs) and all the support components, these boards have become very expensive and must be handled carefully. Thus even though they will be inserted into a test fixture as illustrated in FIGS. 5A and 5B which is extremely robust and built to withstand the insertion and removal of many boards over the coarse of its lifetime, the risk to these expensive boards from poor insertion should be limited. Thus, in the preferred embodiment edge tester, we include a number of features which are illustrated in FIG. 6. In order to determine the particular board, its serial number and type, a bar code 68 is printed on the board itself 61. When the board is nearing insertion, or after its inserted, a scanner 67 will read the barcode 68 and tell the host which board is being/was inserted. The pin connect area 69 will be mated to the opening 64 of a pneumatic pin connector having roughly 300 pounds of force to make contact to the pins in area 69. (In our edge tester, the tester is physically establishing the electrical interfaced to the board under test through a pogo-pin/bed-of-nails interface, which is driven against the board by a giant pneumatic cylinder driven by compressed air. We designed the preferred embodiment for 10,000 insertions, so no wear-out connection replacement mechanism required at the volume we are seeing. Others may desire to design-in replacement mechanisms for higher volume units.)

The plastic block 63 will have at least two holes 65 and 66 which provide a light path through it and a laser or other light source (not shown) will, only when the board is fully inserted, be blocked from being received on the opposite side of the plastic connector 63 by a pair of photo sensors. This will tell the edge tester that the board has been inserted fully, and that the compression connector may be engaged so that electrical connections can be established. All of the controls indicating whether or not the board is connected and which type of board is being inserted may be displayed on the standard PC monitor associated with the edge tester, however, in the preferred embodiment we also include three colored LED's 62A, 62B, and 62C (red, yellow, green, respectively) for indicating the stage of insertion into the back plane 60 of edge connector receptacle 63 of the edge tester.

Figure 7:
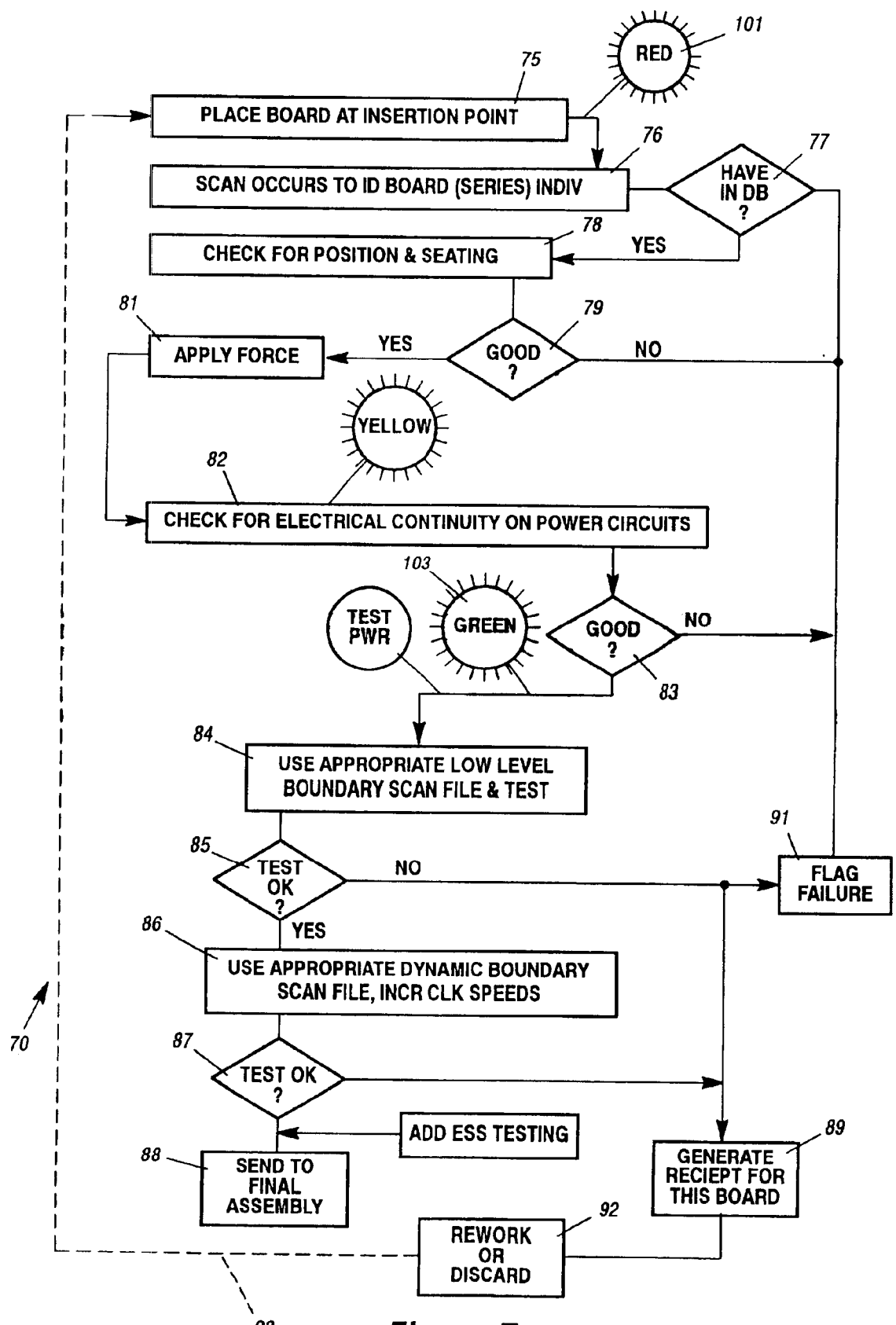
FIG. 7 is a flowchart illustrating the use of the edge tester test in accord with preferred embodiments of this invention.

Refer now to FIG. 7 which the flowchart 70 describes the process of testing using the edge tester in the preferred embodiment. In Step 75, the board is placed at the insertion point of the edge tester and the red light 101 should be displayed. As indicated earlier, these display lights may have corresponding indicators showing on the graphical user interface related to the PC that is the tester host. In Step 76, a bar code scan identifies the board being inserted, preferably not just by series, but also indicating the individual serial number of the board. This may occur after primary positional seating has been determined if desired.

If there is an appropriate data file in the database associated with the tester host, (77) then the next step can occur. Positional seating Step 79 is determined in the preferred embodiment using the optical insertion test points illustrated in FIG. 6. Other means for determining mechanical seating may be employed if desired. If the seating is good, the yellow light should be displayed (and appropriate display may be had on the tester host display as well). At this point, in Step 81, force may be applied and the edge tester may connect itself to the board to be tested. Electrical continuity should be tested next. In Step 82 in the preferred embodiment, the test trace is employed which exists on the circuit board and a simple test vector is pushed through it to determine that the board has been seated electrically. Once this is determined, the power supply routing should be tested, a green light 103 should go on, and appropriate low level boundary scan file may be brought up and tested in Step 84. If at any juncture in this process in Step 77, 79 and

83 for example a failure is found, a failure flag 91 should be produced within an indication identifying the problem discovered being sent to the operator of the test. If the board requires repair, it should be removed and repair should be performed. If the board is not seating well mechanically, it should be removed and a visual inspection made. The same should happen with the low level boundary scan testing and the determination made at Step 85. However, once circuit testing has begun, it is useful to generate a receipt for this particular board being tested in Step 89 so that the operator may known where to look at the board for potential areas of repair. Assuming all of the low level testing is done and the testing of the ASIC circuitry itself as well as dynamic testing of the components interaction is desired, the operator should move to Step 86 in which the appropriate data files for this board will be retrieved in the host and applied through the use of the appropriate preconfigured test vectors from that file and, if desired, increased clock speeds. (Of course, there is no restriction on when these files may be retrieved, just the obvious one that they can't be used until the electrical connections are made and the board type/identity is established). If this test is ok Step 87 thus (no repair is required and there is no discernable failure mode discovered), additional environmental stress testing (ESS) may be performed if desired before sending the board to final assembly Step 88. If for any reason a receipt showing errors for this board has been generated in Step 89, the repair or discarding of the board in Step 92 should begin, and if it is repaired, then the board may be sent back through testing in Step 75 once again through path 93.

Translation from TCL to SVF.

Figure 11:
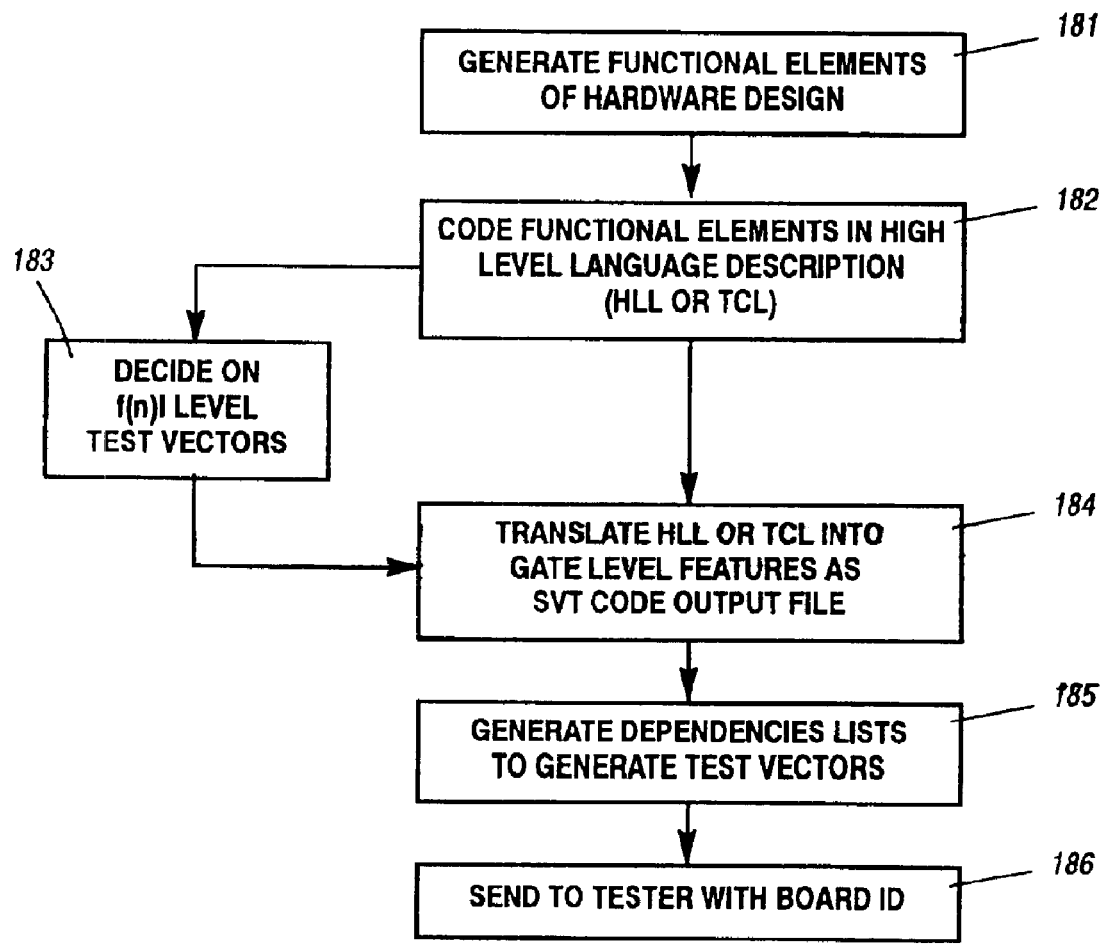
FIG. 11 is a flowchart illustrating the general flow for how the translation from a High Level descriptive Language (HLL) to SVF is accomplished.

As mentioned above, SVF is a convenient language since it has commercial support by JTAG Technologies which is an industry leading test software provider to the world. One can translate the high level descriptive code into SVF using a translation program, and then the gate level hardware description is accessible to the assembler/tester/manufacturer without any understanding of the nature of the functions carried out by the hardware, but with an ability to generate test vectors based on the gate level description in the SVF code statements. This process has the designer first (FIG. 11) generate the functional elements of the hardware design 181, then code the functional elements into the high level language the designer is using to hold the hardware description. We used TCL, but many designers use C#. At this stage one should decide what functional testing should be accomplished in the test platform 183. That is, one should decide which hardware blocks depend upon others in a functional way and decide how to establish that these dependencies are tested. A set of test vectors should be generated at this point to cover these dependencies. The whole hardware description should then be translated into gate level description by a translator constructed to take the relevant statements from the high-level language and translate them into SVF statements of gate level hardware 184. Then the gate level dependencies lists can be drawn up and routing figured and test vectors produced automatically 185, through the software supplied by the test software vendor, in our preferred systems, JTAG Technologies.

Once this is accomplished, the board identity will be associated with the test vector and net list files that can be then sent to the assembler/tester/manufacturer 86, so that this third party can do the testing of these boards.

Any time modifications to the design of the boards is required, this test vector and net list generation process should be repeated and a new board identity associated with a new file to also be sent to the third party manufacturer/tester/assembler.

Detailed Description of TCL to SVF Conversion and Use.

Phase 11 edge testing is defined as the ability to run at speed unit level subtests of a Unisys system on a High Level Assembly (HLA) using the maintenance interface available on the edge of the HLA. By using the processes we describe herein, such testing on HLAs can be accomplished without giving to the tester any functional data regarding the system beyond the hardware level test vectors.

Proprietary unit level tests depend on proprietary hardware, software, and contain commands that are typically proprietary. The goal of the process is to translate these unit tests from this proprietary form into a form that is a non-propriety, and preferably an industry standard. The process by which this translation occurs is described in detail but should be read with a mind to its application to similar processes with software of a similar nature.

Unit level tests have been run on a functional unit, when the unit exists as part of a computer system. Each large multiprocessor computer system includes hardware and software a support or maintenance processor subunit that has a way to control and manage the large computer system using this processor. In Unisys computers this processor is called a System Support Processor (SSP). The System Support Processor consists of a hardware part know as the Common Scan Engine (CSE) and a software part know as the Management Application Platform (MAP). The System Support Processor is the device through which initialization, configuration and diagnostics are run on the large multiprocessor computer system.

Figure 8A:
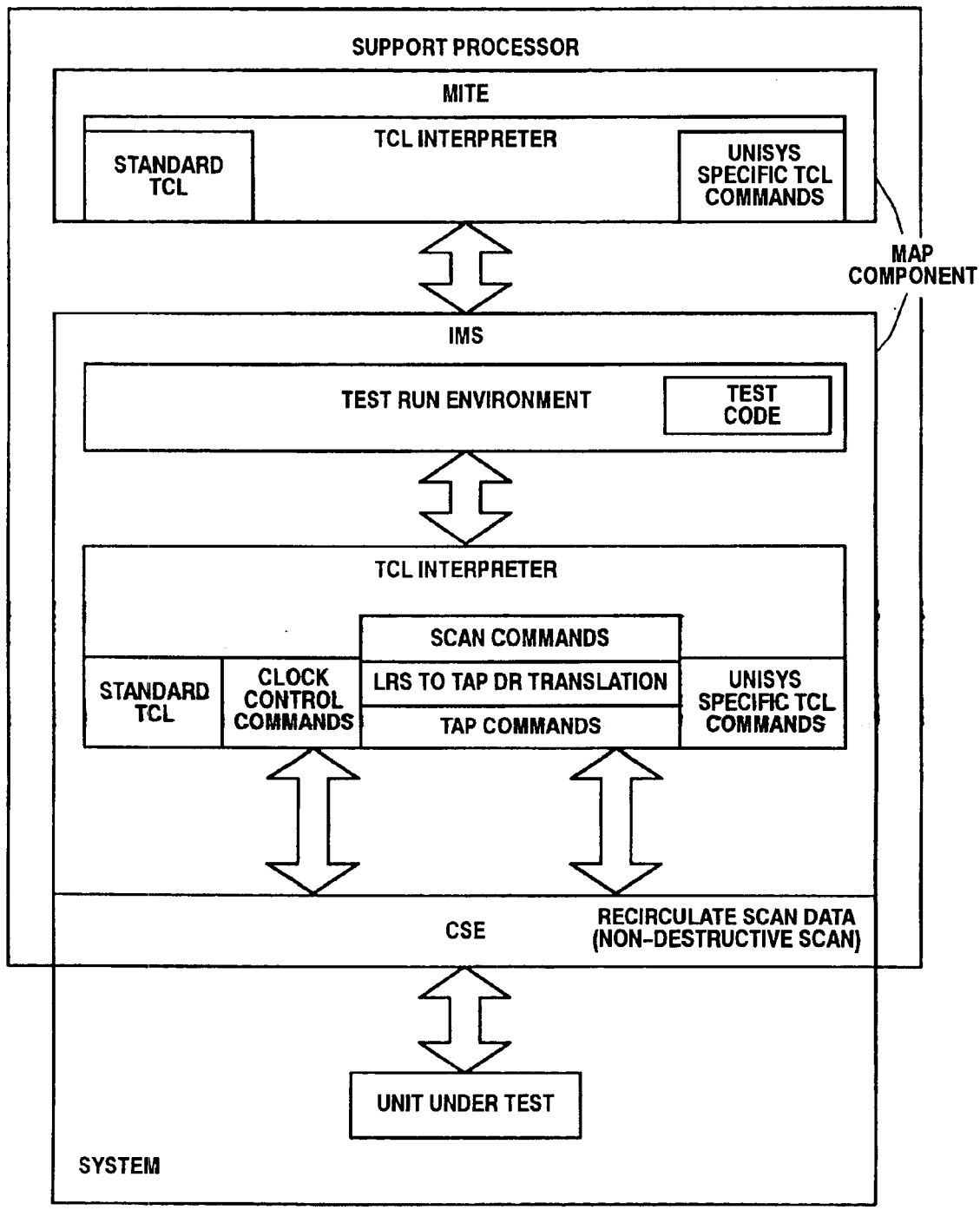
FIGS. 8A and 8B are component interaction block diagrams describing the TCL to SVF conversion process.

The Unit tests are executed by the System Support Processor, and assume that all the features of the system and the system support processor are present (Refer to FIG. 8A, which illustrates the component layout in testing within a functional system). It functions with three main features that must be considered in designing the translation between high-level test language code (we use TCL) and the SVF code, handleable by JTAG tech software. These features are:

The MAP translating the test language commands into commands for the Common Scan Engine, which the CSE translates into commands on the maintenance (TAP and I²C) interface of the Unit.

The MAP translating logical register references into bits of a TAP Data Register (DR). (See Below)

The CSE having the ability to do nondestructive scans.

The high-level test language is based on the TCL language, but includes Unisys proprietary commands. These proprietary commands ultimately get translated by the SSP into the commands on the maintenance interface, but will not be available to the third party manufacturer. Within, we describe two particular example commands and how the translation is handled.

Another consideration when translating the test code is the different test perspectives when operating in a system environment verses an assembly test environment. The Unisys unit level tests are executed in a system environment. In the system environment the perspective is to think from a functional perspective, not a physical hardware perspective. In an assembly test environment, the perspective is to think from a physical hardware perspective not from a functional perspective. We will use a board with four processors as an example to illustrate this point. In the system environment perspective, these four processors may functionally be configured to operate as two 2× (2× meaning having two processors each) systems, with only one 2× unit being enabled. The system level tests will "probe" the system and determine that only one 2× is enabled and test only for a 2×. It will not care why the other 2 processors are unavailable. In an assembly test perspective, the components present is determined by the assembly part number. The tests that will be run are based on the assumption that for a particular part number a fixed configuration of components is present. The test will pass if all the components that are called out for the assembly configuration that is under test, test as present. In our example case the assembly test will test for the presence of 4 processors, and only if all four processors pass the test, will the assembly successfully complete testing, thus, the enabled 2x system with 2 non-enabled processors will fail, even though that may be an acceptable state from a functional system perspective.

Figure 9:
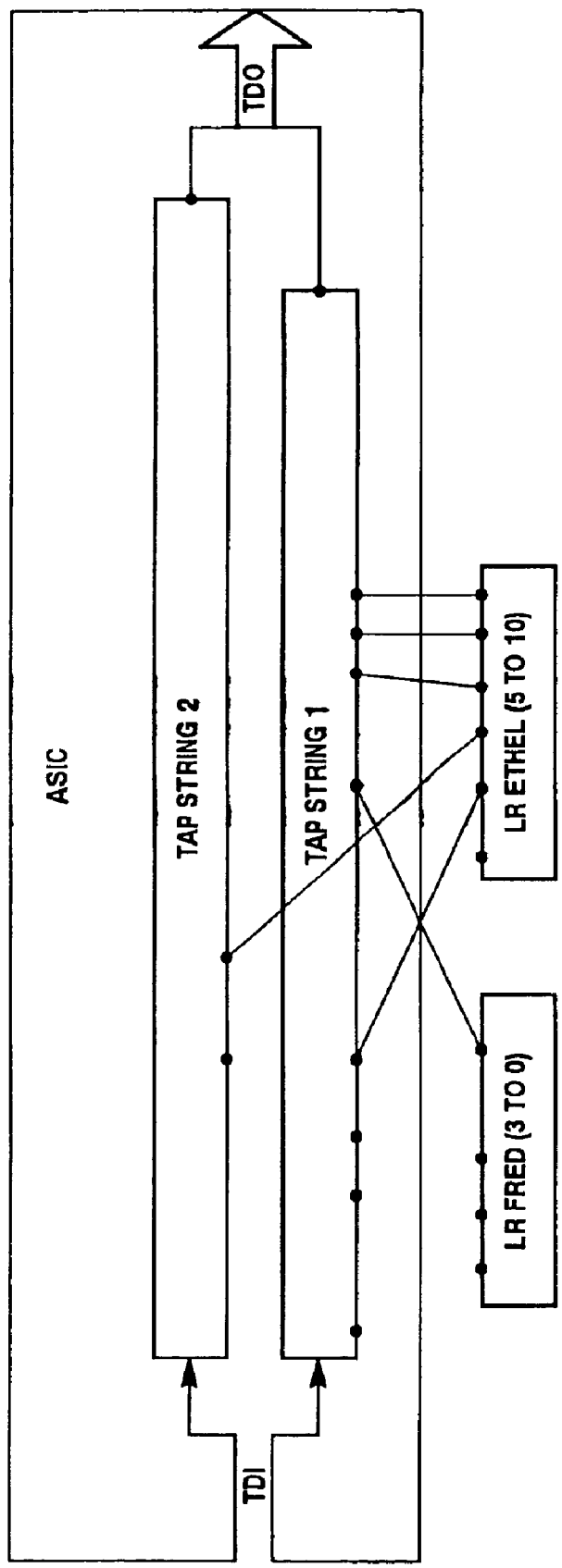
FIG. 9 is a Heuristic diagram illustrating how logical registers are related to TAP strings in an example operating in accord with the invention.

Testing at the system level is based on the writing and reading of logical registers (Irs). Logical registers can be thought of as any grouping of state points. In most cases a logic designer defines them. The data bits of an Ir need not be consecutive bits on a TAP data register (string) and may be on one or more TAP data registers. (See FIG. 9 for an illustration of distribution of data points from Irs Ethel and Fred across the TAP data registers).

Any read of a TAP data register should be nondestructive or the value will be lost and the test useless. This means that the data shifted out of the TAP data register, must be shifted back in.

On a write of an Ir only the bits that are specified by the Ir should change. The rest of the data on the TAP data registers must remain unchanged. This means that each bit of data that is shifted out during the write of the TAP data register (string), must be written back to the register (string) except for those TAP data register (string) bits that are part of the Ir that is being written. For those bits the data must be the value specified by the Ir write. In the preferred embodiment systems, this required non-destructive recirculation is built into the Common Scan Engine (CSE). On the edge tester the recirculation of the data is built into the SVF test vectors. (Note that the WRITE command in the form of TCL we use is called a FORCE command, and that commands like this must be translated along with the test vector translation that occurs as described later).

CSE is the Unisys Common Scan Engine, a hardware module on the Service Processor that scans all hardware units for discovery, configuration, and diagnostic purposes. It is the proprietary interface for the TAP system described by its common features and full descriptions in the IEEE literature Standard 1149.1. Most hardware manufacturers implement TAP registers for similar purposes and have their own interface modules to these diagnostic and maintenance and configuration registers, but the concepts taught herein apply to all similar systems as will be understood by those of ordinary skill in these arts.

Figure 8B:
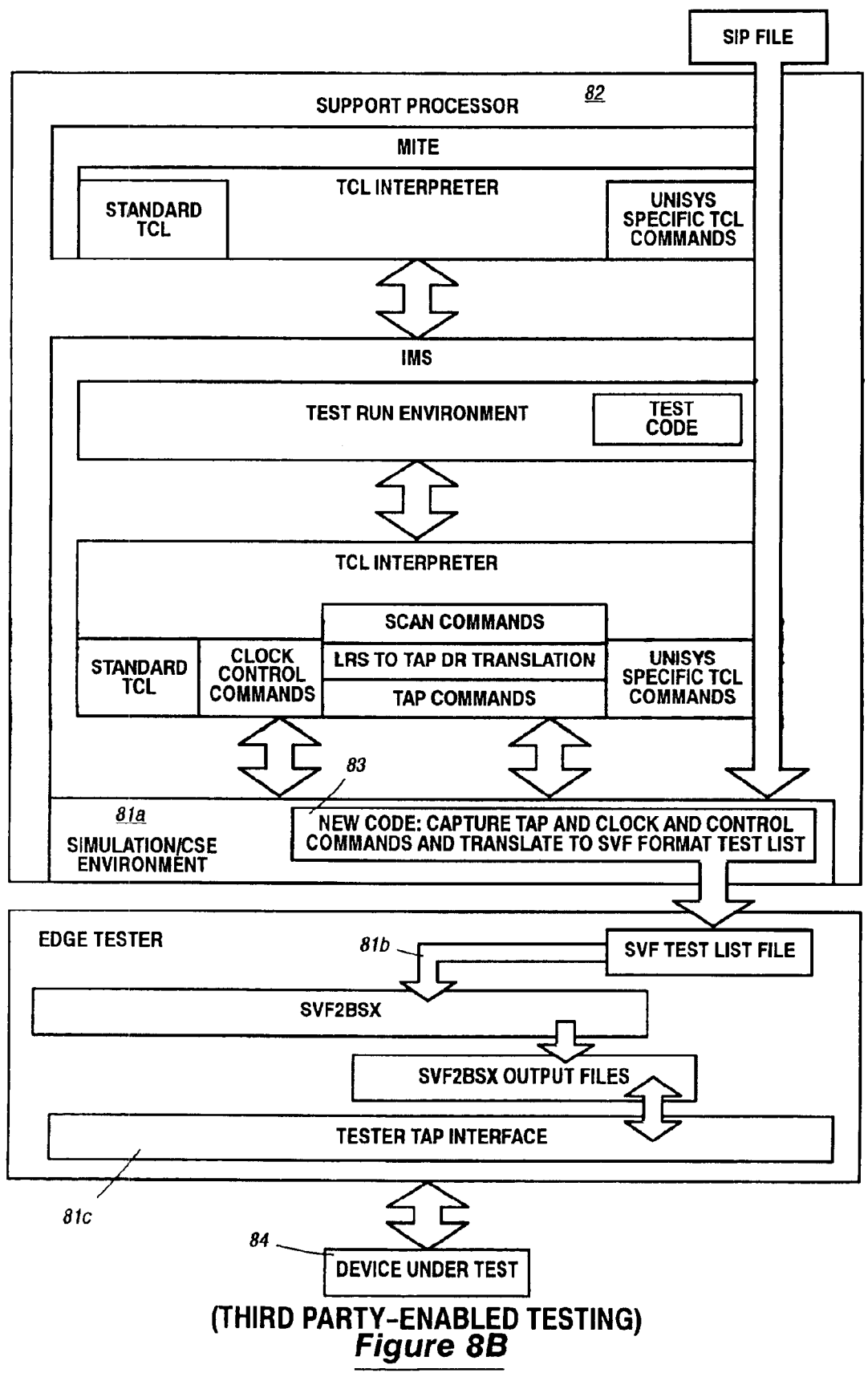

Refer now to FIG. 8B, in which the components are configured for operation in the third party manufacturer consistent with the concepts of this invention. Using a simulator 81a for the CSE, we use the system support processor itself 82, and take advantage of the command substitution capability of the TCL language to do the conversion of the test code. For any command that will need code added in order to create the SVF test file, we substitute for the existing TCL command, a new command that executes the code that is needed for the conversion, and then executes the original command. This allows us to generate the SVF code, while at the same time the results of the command are the same as before the code generation commands were added. The code that is added also has the ability to restore the commands to their original state.

Even though the language that is used on the Support Processor is based on TCL an industry standard language, the proprietary extensions in software and hardware exist. What we do could be considered the equivalent of "compiling" a high level proprietary language into an industry standard generic "assembly" format. Generally, we create SIP files (State Item Parameter files) to hold the state item parameters and we create other translation relevant files to make this work. Thus, a scan command will be translated as per one of these translation files in the NEW CODE generating section 83 into an SVF command file format for the SVF Test List File, and the clock and control commands will also be translated to that format. Scan commands will have things in them like the Ir Fred or Ethel (from FIG. 9) and how the distribution in the TAP register logical sequence is oriented in the tables used by SVF for that purpose, thus forming a properly formatted scan command for the SVF Test List File. In using SVF in the JTAG Tech system, the SVF Test List Files are translated into SVF2BSX output files through programs provided by JTAG Tech, and these are the files that are pushed through the Tester's TAP interface (part of the simulated CSE environment that connects to the unit under test 84).

The State Item Parameter (SIP) file is a file that is an input file to the MAG (Maintenance Access Generation) process. The file contains information on the length of the tap instruction registers, what the tap data register instructions are, and the allowed functional clock state when executing the tap data register instructions. Reading this file is how the TCL to SVF process knows what the tap data registers are, and what tap instructions read and write the tap data registers. This file serves the same function for a UUT (Unit Under Test) as a BSDL file does for a device.)

To make this translation function properly, we assume certain characteristics of the system under test as follows.

1) The UUT (Unit Under Test) is initialized into the test mode by loading a particular state pattern on the unit.
2) The functional clocks are allowed to run for an amount of time sufficient for the test to run. The test does not require an exact amount of clock pluses, but an amount of clock pulses equal to or greater than the number required for the test to be completed.
3) The UUT state is then examined to see if it matches the expected results.
4) For a given configuration of the UUT the initialization patterns are fixed, they are not dynamically or randomly generated.
5) The expected results are also a fixed value and the results do not affect what results are read, or the expected value of the results. All the results will have a known set value for the configuration under test if the diagnostic test passes. If the test fails some of the expected results may or may not be relevant. For example An error flag bit may be read to determine if a test passes or fails, and if the test fails then an address register's value may determine the error location, but if the error flag indicates that the test passes, the address register will be a known value.

Further, some modifications have to be made to the test code to generate the SVF vectors successfully. These modifications include:

1) Timed multiple passes looking for test complete, changed to one pass within a maximum time.
2) Simulator forced to "passing" results, but code changed so that any action that is to occur if a failure occurs is also executed.

In converting from a "high level" test language to a "low level" test language some additional limitations occur.

Deterministic type testing only. No decisions allowed except pass/fail.

Configuration of the unit is fixed and determined by the hardware. "Probing" if it occurs will only determine that the available hardware matches the expected configuration.

Scan will be nondestructive only if the data that is scanned out matches the expected results. The data to shift into a data register will have been determined by the value that the simulation has determined for that data register before the scan has occurred. For a value command if the data that is scanned out does not match the expected results, then the data that was specified as the data to shift in does not contain the appropriate data and has destroyed the state of the unit. To handle this limitation, all value commands (read operations) are placed in a queue to be executed as a group. The queue is checked and the value commands are executed before any change of state command (force, after), and at the end of the test.

The operator has limited knowledge of functionality of the unit under test (a key benefit in dealing with third party manufacturers as mentioned earlier). If a failure on the UUT (Unit Under Test) occurs the test system needs to tell operator what to replace, repair, it cannot depend on the operator to have knowledge of the UUT's functionality. Thus, suggested repair files should preferably be constructed to match failures. The goal of error reporting of a diagnostic failure during production testing is to provide the operator with what corrective action needs to be done on the UUT to repair the defect that the test has found. This means isolating the failure to a component, or net and if appropriate a particular pin on a component, or a particular pin or via on a net. The isolation should occur as part of the diagnostic error reporting with little or no intervention or interpreting of the results by the operator.

As part of the solution for this last point, Unit level tests compare the expected values of Irs to the actual results to determine if a test passes or fails, and if a test fails it uses the values of Irs to determine what isolation information to report. There are three general schemes used for error reporting/isolation for Unit level tests.

1) The first scheme treats each individual bit of an Ir that does not match the expected data as reporting a failure. This is the scheme that is used for isolation for the proprietary interconnect tests.

2) The second scheme uses the expected value of an Ir as an error code. For example the tagbist test (a "built-in self test") compares the value of the Ir: t0tagram_bist_syspf (just a name) to a known value to determine which bank of memory had an error. It does not depend on knowing if other vectors had the expected results.

3) The third scheme will look at all the expected results to determine what the error isolation should be. For example if for the static string diagnostic test, the isolation would be different if a single bit of a register could not be wrote and read as being set to a one, then if all the tests indicated that no bit could be wrote and read as being set to a one. The first case indicated a problem on the register itself, whereas the second case indicated a problem with the maintenance interface of the ASIC. In this scenario all the patterns of a test must be analyzed, both the patterns that match the expected results and the patterns that do not.

The JTAG tech software will report failures on tests generated from the SVF files as a failing vector, and identify the TAP string and bit on the string, so from this information, using the isolation schemes, error reports that can be used by the third party manufacturer can be generated.

There are two steps into converting this error report into isolation information. First the SVF Error report must be converted into Ir actual values (form the original proprietary test Ir vectors), and then the Ir actual values must be compared against the expected results according to the appropriate isolation scheme for the diagnostic test that is reporting the failure. The isolation file created by the TCL to SVF Generation process will contain the information required for both these steps. A program/code will be provided to read both the TCL to SVF isolation file and the JTAG Tech error results file and output the appropriate isolation information based on this information.

Figure 10A:
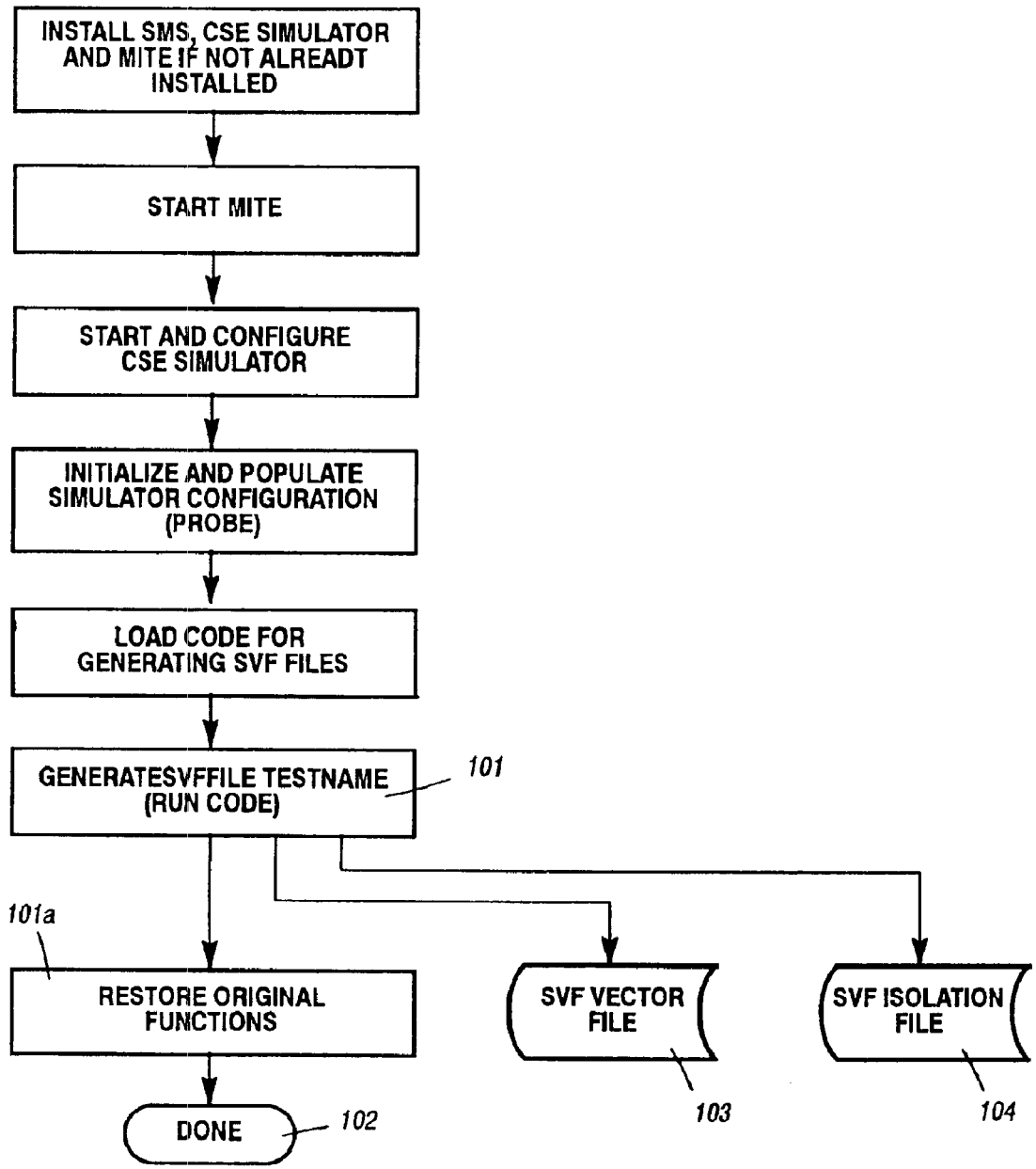
FIGS. 10A–I are flow charts detailing the functional language description to SVF language description conversion and use processes in accord with preferred embodiments of this invention.

FIGS. 10A–I describe the process of how the conversion is accomplished in more detail, but generally follows the description flow just above written. FIG. 10A illustrates the Unit Test to SVF format conversion process. Block 101 is the GenerateSVFFile "testname", which is the block that runs the code for generating SVF files from the high level language files (in the preferred embodiment, TCL files, but other languages that can be used for hardware description such as C# are acceptable but not presently preferred). The SVF files are to be of two types, Vector and Isolation types. The Vector type contains the information about the test vector(s). The Isolation file has information on how to isolate errors; tables to translate vector numbers and bits into expected values on TAP instructions and into TCL Irs that we started with in the TCL format, so that we can use them to determine the particulars of any failures during testing. The restore original function block 101a restores the state back to the original condition.

Figure 10B:
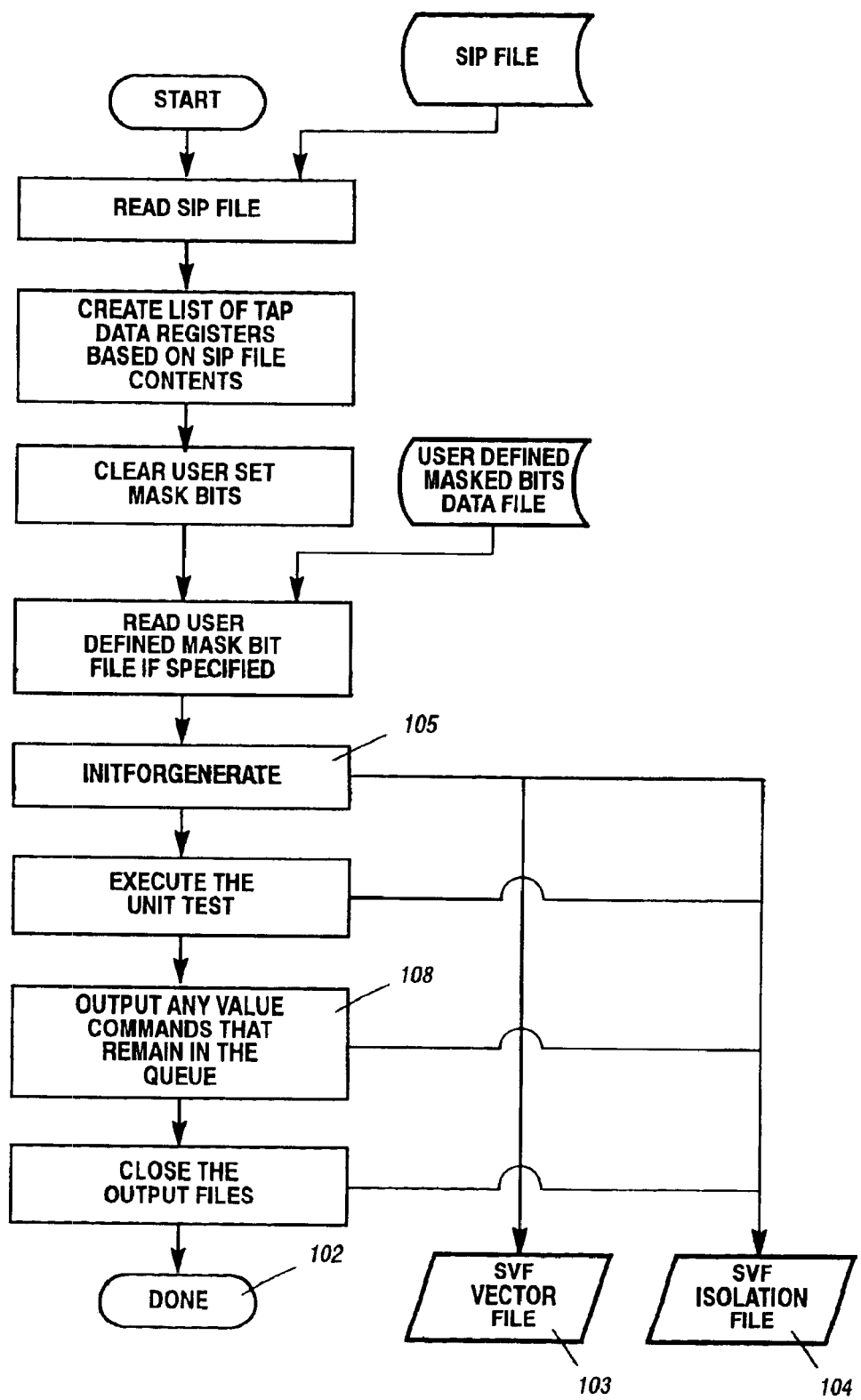
Figure 10C:
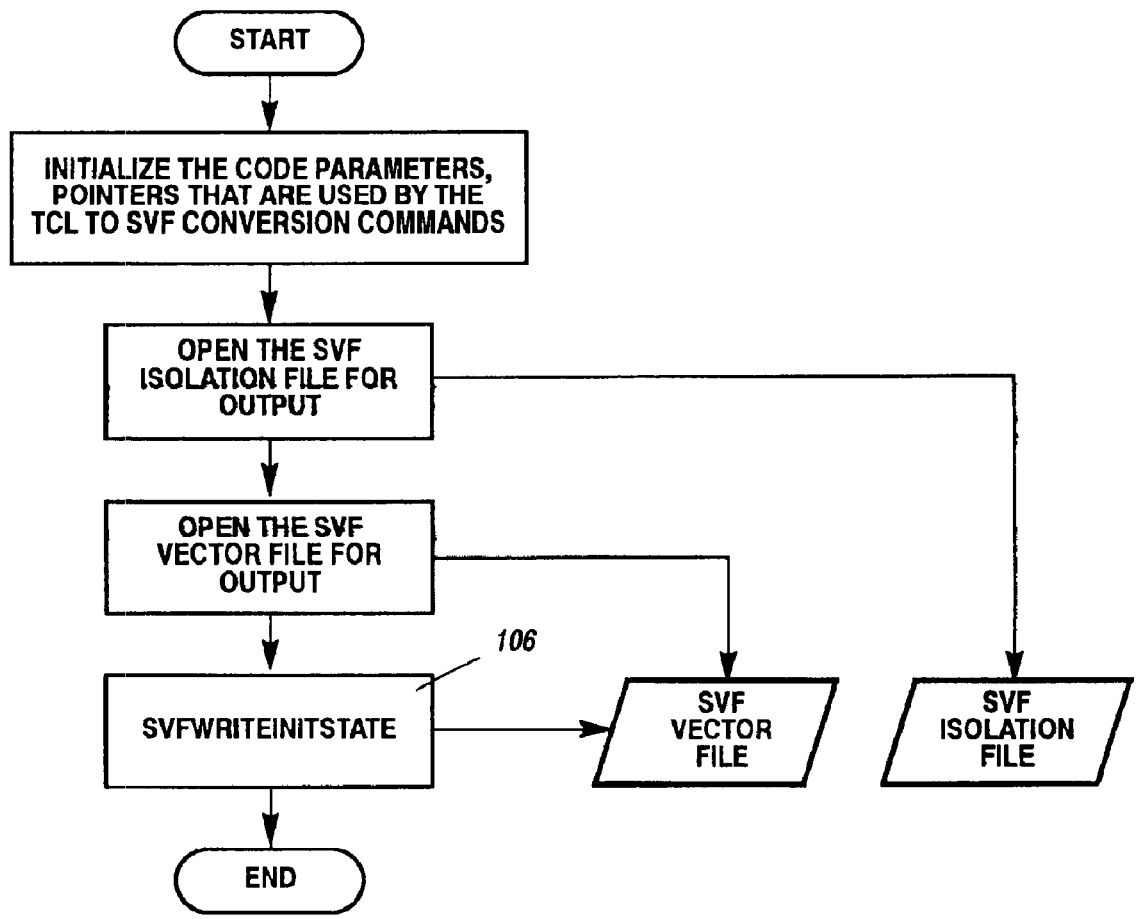
Figure 10D:
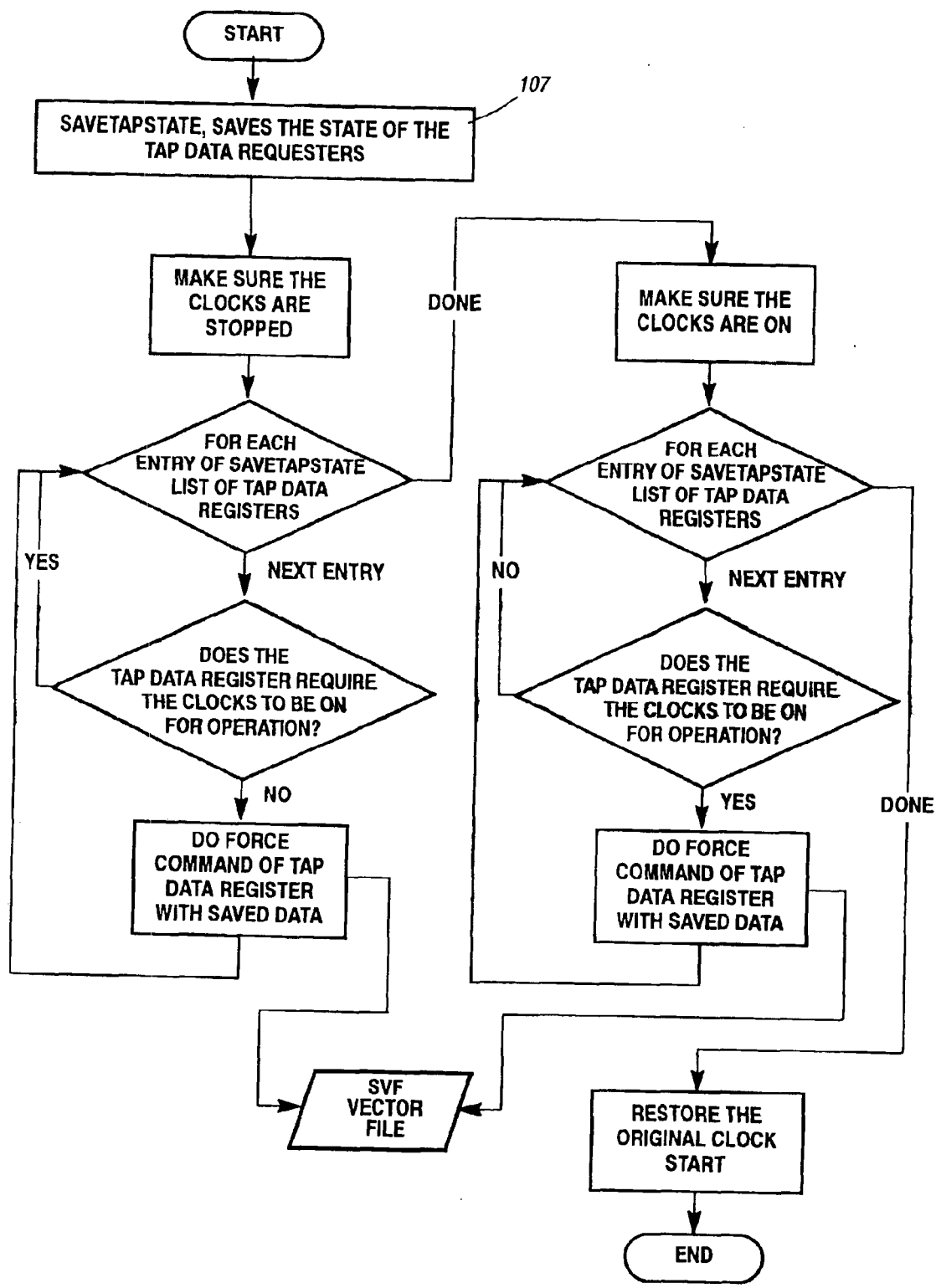
Figure 10E:
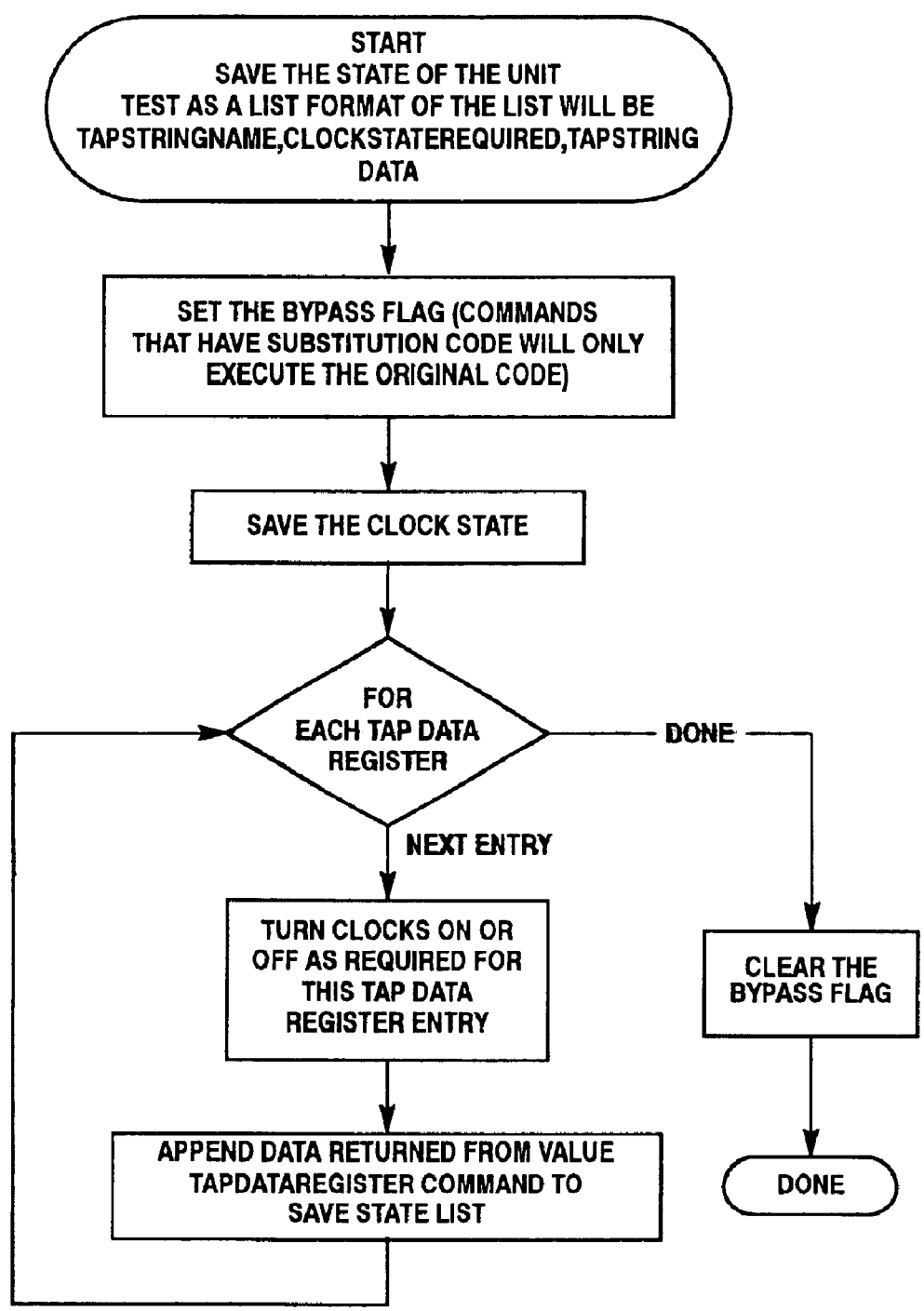
Figure 10F:
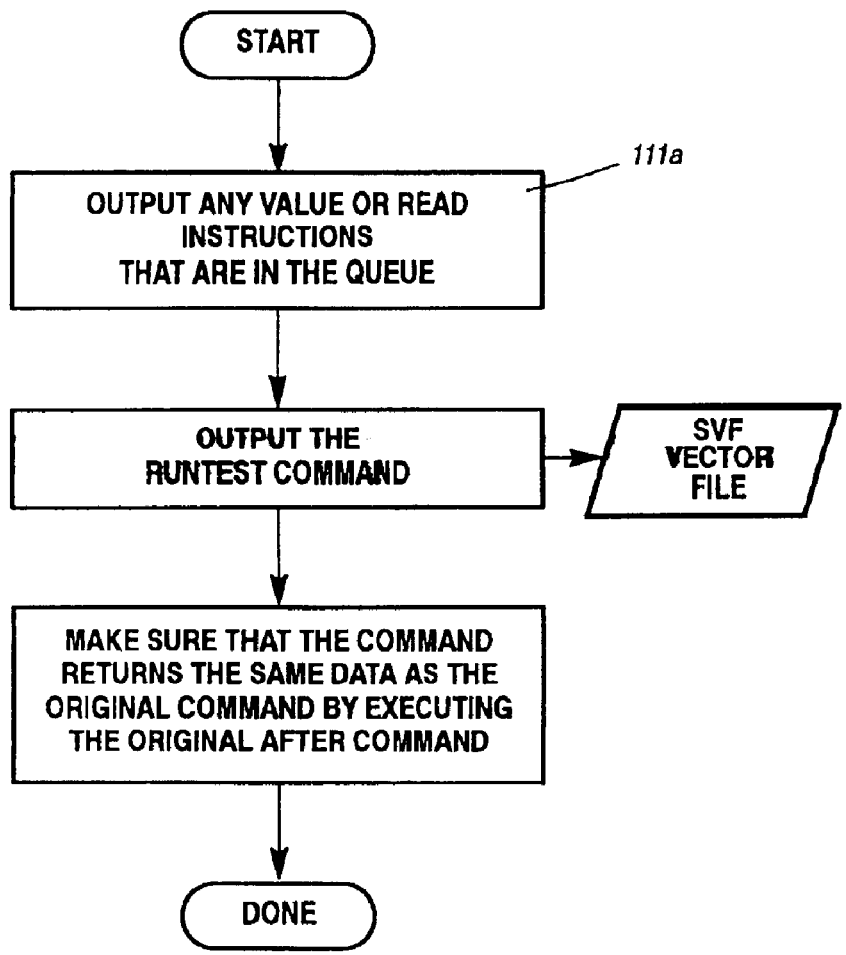
Figure 10G:
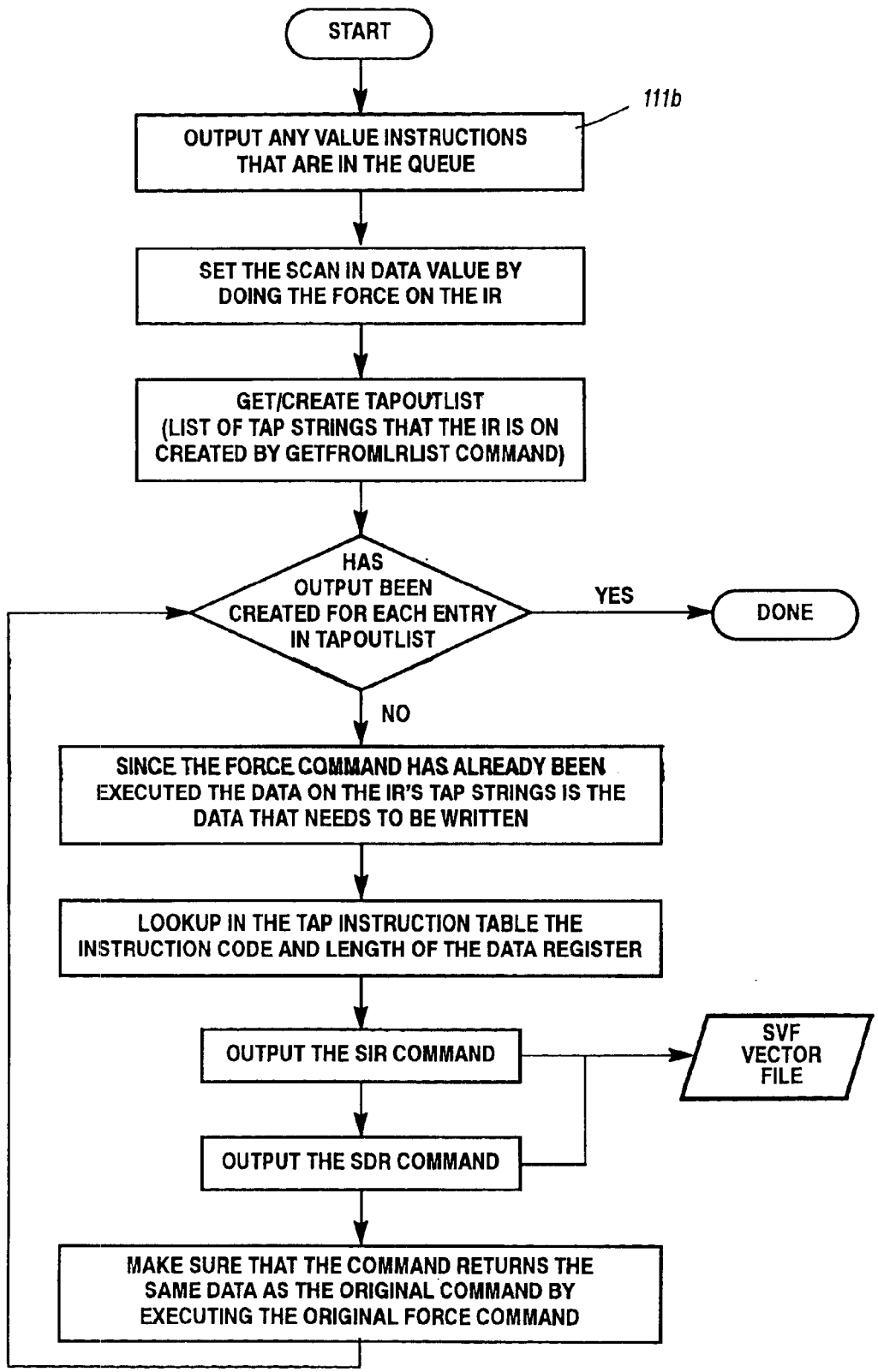
Figure 10H:
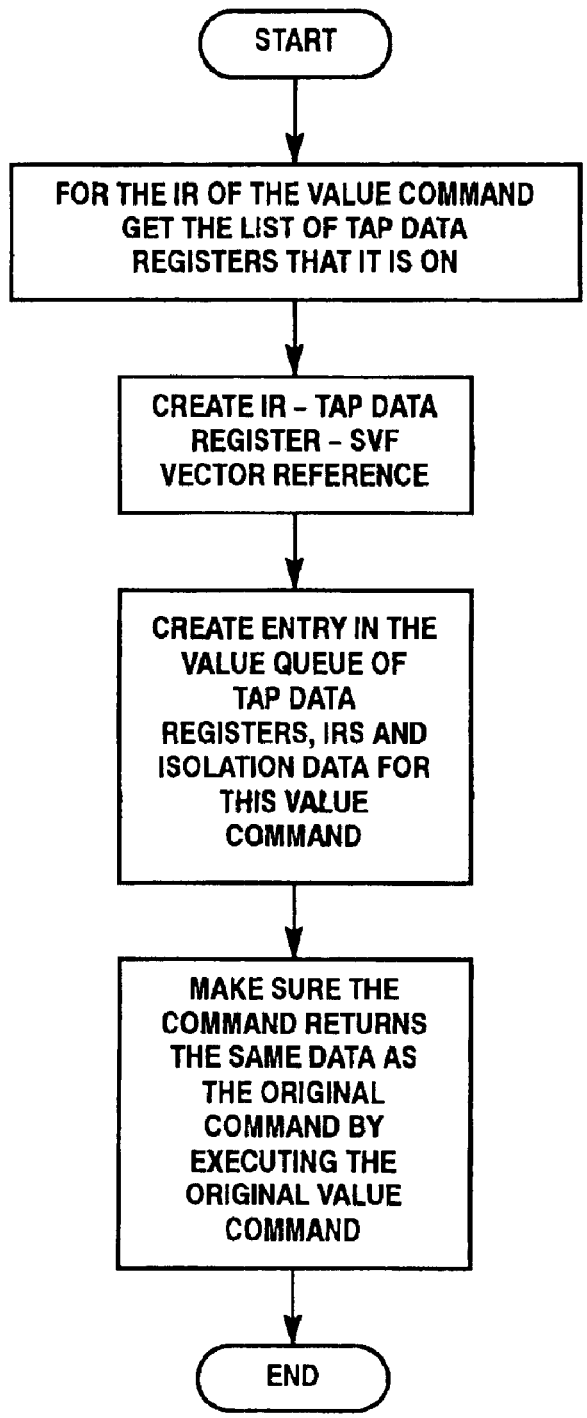
Figure 10I:
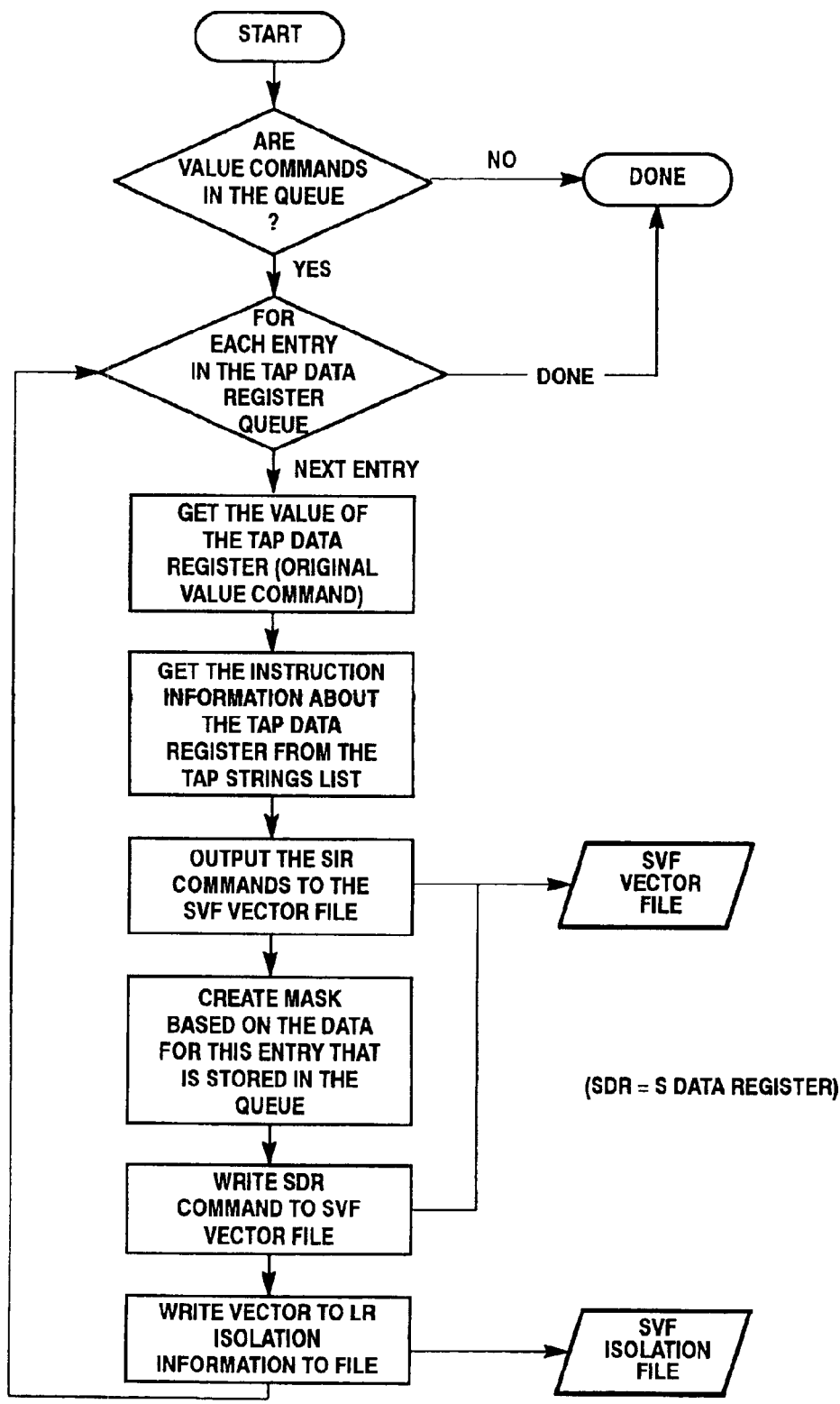

The block 101 from FIG. 10A is expanded in FIG. 10B to illustrate the details of the function called Generate SVFfile of "testname". The InitForGenerate block 105 is expanded in FIG. 10C. The writeInitState command of FIG. 10C is detailed in FIG. 10D, and describes how clock states are dealt with. Before the blocks of FIG. 10C can be executed, block 107, SaveTAPstate command must be handled, and FIG. 10E expands on how this is done. FIGS. 10F, 10G, and 10H are flow charts of procedures to handle the translation of what we call FORCE, VALUE and AFTER commands from TCL to SVF. A FORCE is essentially a WRITE command, a VLAUE is essentially a READ command and an AFTER is like a wait command. The VALUE command is handled in block 111a of FIG. 10F, and a RunTest command sends the output of the VALUE command into the SVF Vector file. Note that block 111a requires that all VALUE commands be executed together to ensure that we get uncorrupted data into the test process (i.e., so all READs execute together without allowing for multiple tests on the same data which may have been corrupted during a first or other earlier test). Block 111a is expanded upon in FIG. 10H. FIG. 10G translates the FORCE command into the SVF format, producing as output the SVF Vector file.

Accordingly we have described the invention in general terms, and it should be recognized that the scope thereof is only limited by the appended claims.

What is claimed is:

1. A method for testing a variety of circuit boards for a family of large electronic systems comprising:

establishing a tester on-site with a third-party manufacturer/assembler/tester, said on-site tester having a connector mechanism for connection to each of said variety of circuit boards, translating a high-level language description file containing a high level language description of hardware for one of said variety of circuit boards into a low level vector format file, providing said low level vector format file for said one of said variety of circuit boards to said third-party manufacturer/assembler/tester, wherein said low level vector format file contains a test string for said one of said variety of circuit boards be tested, and wherein from said low level vector format test sings said third-party manufacturer/assembler/tester can establish a set of test vectors to use in performing a scan test on substantially said each one of said variety of circuit boards in said on-site tester.

2. The method of claim 1 wherein said low level vector format is SVF format.

3. The method of claim 2 wherein said low level vector format files include a vector file and an isolation file.

4. The method of claim 1 wherein said high-level language is Tcl.

5. The method of claim 1 further comprising applying said set of established test vectors in performing a scan test on one of said each one of said variety of circuit boards.

6. The method of claim 5 wherein prior to applying said set of established test vectors, applying test vectors derived from net list and BSDL data for static testing.

7. The method of claim 1 wherein said low level vector format file contains SVF formatted static test data useful for internal ASIC static scan testing.

8. The method of claim 1 wherein said low level vector format file contains SVF formatted dynamic test data useful for at speed testing.

9. The method of claim 1 wherein a unique SVF formatted file is created for each version of said one of said variety of circuit boards.

10. The method of claim 1 wherein said SVF formatted file is downloaded into said on-site tester directly from an owner.

11. The method of claim 1 further comprising during an installation step in which a unitary board of one of said variety of circuit boards is fitted into said tester for testing, wherein a symbolic code on a surface of said unitary board is read to determine which test vectors will be used for testing said each unitary board.

12. The method of claim 11 wherein said symbolic code is a bar code and said bar code is unique for each unitary board of each of said variety of boards.

13. The method of claim 11 wherein said symbolic code provides a unique identifier for tracking said each unitary board.

14. The method of claim 11 wherein said symbolic code is a bar code and said bar code is unique for each version of said one of said variety of boards, thus providing granularity down to a version level in said determining of which test vectors will be used for testing unitary boards.

15. The method of claim 1 wherein said translating step comprises restating any proprietary format statements from said high level language into low level statements and using a file of all relevant low level statements for building a vector file containing test vectors, and wherein said vector file is ordered appropriately for use to effectively scan through a TAP interface to said one of said variety of circuit boards into appropriate scan registers on a unitary board of said one of said variety of circuit boards that is under test.

16. The method of claim 1 wherein said translating step comprises building an isolation file for later use in comparing to any found errors which are accumulated from a testing step wherein said testing step includes reading output of a test vector result from testing a unitary board, and wherein said comparing produces an indication of error type and physical circuit location where error indicates a problem with the unitary circuit board.

17. The method of claim 16 further comprising creating a file having a list of any errors and indications of the problem the error indicates.

18. The method of claim 17 further comprising printing a receipt having human readable information taken from said file having said list of any errors and indications, said receipt for association with said unitary board.

19. The method of claim 1 further comprising testing said one of said variety of boards by initializing into a test mode by loading a particular state pattern onto a unitary board after fitting said unitary board into said tester, allowing to run functional clocks finked to said fitted unitary board for an amount of lime sufficient for a test to run with an amount of clock pulses equal to or greater than the number required for the test to be completed, examining the state of said unitary board to see if it matches expected results.

20. The method of claim 1 further comprising assembling a computer system with said unitary board.

21. The computer system assembled in the process of claim 20.

22. A method of testing multiple non-identical models of circuit boards of different models using a single test apparatus comprising, providing software data useful to test said non-identical models of circuit boards to a computer facility associated with said test apparatus determining which model of said non-identical circuit board is to be tested electrically connecting a one of said models of said non-identical circuit boards to be tested to the test apparatus, applying the appropriate test software for said model to said circuit board being tested to said computer facility based on said determining step, and running said appropriate test software for said model, wherein, said supplying the software to test each circuit board model, is completed by a) delivery of said software to a subcontractor for use in said computer associated with said test apparatus in said subcontractor's facilities, and b) by said subcontractor formatting test vectors in said software into a form suitable for use in said circuit board model.

23. The method of claim 22 further comprising:

producing a receipt of likely faults to be associated physically with said circuit board being tested.

24. The method of claim 22 wherein said subcontractor develops test vectors from said software to produce said appropriate test software from said provided software.

* * * * *